United States Patent
Kim et al.

(10) Patent No.: US 12,382,793 B2
(45) Date of Patent: Aug. 5, 2025

(54) DISPLAY APPARATUS HAVING TRANSMISSION AREA AND PIXEL AREA, AND METHOD OF MANUFACTURING THE SAME

(71) Applicant: Samsung Display Co., Ltd., Yongin-si (KR)

(72) Inventors: Jaeik Kim, Yongin-si (KR); Hyejin Gwark, Yongin-si (KR); Jungsun Park, Yongin-si (KR); Heemin Park, Yongin-si (KR); Yongsub Shim, Yongin-si (KR); Yeonhwa Lee, Yongin-si (KR); Joongu Lee, Yongin-si (KR); Jongbeom Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/441,648

(22) Filed: Feb. 14, 2024

(65) Prior Publication Data
US 2024/0224579 A1  Jul. 4, 2024

Related U.S. Application Data

(62) Division of application No. 17/337,870, filed on Jun. 3, 2021, now Pat. No. 11,943,957.

(30) Foreign Application Priority Data

Jul. 10, 2020 (KR) ........................ 10-2020-0085677

(51) Int. Cl.
*H10K 59/124* (2023.01)
*H10K 50/16* (2023.01)
(Continued)

(52) U.S. Cl.
CPC .......... *H10K 59/124* (2023.02); *H10K 50/16* (2023.02); *H10K 50/171* (2023.02);
(Continued)

(58) Field of Classification Search
CPC .... H10K 50/844; H10K 50/16; H10K 50/171; H10K 71/00; H10K 50/858;
(Continued)

(56) References Cited

U.S. PATENT DOCUMENTS 8,994,010 B2  3/2015  Choi et al.
9,219,251 B2  12/2015  Kang et al.
(Continued)

FOREIGN PATENT DOCUMENTS

KR  10-2015-0061995  6/2015
KR  10-2015-0082014  7/2015
(Continued)

*Primary Examiner* — Caleb E Henry
(74) *Attorney, Agent, or Firm* — KILE PARK REED & HOUTTEMAN PLLC

(57) ABSTRACT

A display apparatus includes a substrate including a display area including a transmission area and a pixel area, and a peripheral area adjacent to the display area; a display element disposed corresponding to the pixel area, the display element including a pixel electrode, an intermediate layer on the pixel electrode, and an opposite electrode on the intermediate layer; a hydrophobic layer disposed corresponding to the transmission area; and a plurality of fine particles disposed on the hydrophobic layer, the plurality of fine particles and the opposite electrode including a same material.

20 Claims, 19 Drawing Sheets

(51) Int. Cl.
*H10K 50/17* (2023.01)
*H10K 50/844* (2023.01)
*H10K 59/131* (2023.01)
*H10K 59/65* (2023.01)
*H10K 59/80* (2023.01)
*H10K 71/00* (2023.01)

(52) U.S. Cl.
CPC ....... *H10K 50/844* (2023.02); *H10K 59/8731* (2023.02); *H10K 59/879* (2023.02); *H10K 71/00* (2023.02); *H10K 59/131* (2023.02); *H10K 59/65* (2023.02)

(58) Field of Classification Search
CPC .. H10K 59/124; H10K 59/123; H10K 59/131; H10K 59/65; H10K 59/122; H10K 50/84; H10K 30/865; H10K 59/00; H10K 59/12; H10K 50/85; H10K 59/8731; H10K 59/879; G09G 3/3208
See application file for complete search history.

(56) References Cited

U.S. PATENT DOCUMENTS

| | | | |
|---|---|---|---|
| 9,245,931 B2 | 1/2016 | Cho et al. | |
| 9,577,013 B2 | 2/2017 | Park | |
| 9,674,947 B2 | 6/2017 | Shim et al. | |
| 9,768,416 B2 | 9/2017 | Choi et al. | |
| 9,853,249 B2* | 12/2017 | Chung | H10K 59/12 |
| 9,985,080 B2 | 5/2018 | Choi et al. | |
| 10,074,705 B2 | 9/2018 | Chung et al. | |
| 10,332,947 B2 | 6/2019 | Kim et al. | |
| 10,714,710 B2* | 7/2020 | Woo | H10K 85/636 |
| 11,271,053 B2* | 3/2022 | Liang | H10K 59/1213 |
| 2005/0151830 A1* | 7/2005 | Yamazaki | H10K 59/38 |
| | | | 347/238 |
| 2007/0195240 A1* | 8/2007 | Han | G02F 1/133553 |
| | | | 349/114 |
| 2009/0251452 A1* | 10/2009 | Kang | G09G 3/3233 |
| | | | 345/82 |
| 2009/0316083 A1* | 12/2009 | Kishioka | G02F 1/133526 |
| | | | 349/95 |
| 2015/0194634 A1* | 7/2015 | Kang | H10K 50/858 |
| | | | 257/40 |
| 2016/0111666 A1* | 4/2016 | Jung | H10K 77/111 |
| | | | 438/23 |
| 2019/0103576 A1* | 4/2019 | Okada | H10K 59/877 |
| 2020/0176519 A1* | 6/2020 | Seo | H10K 59/121 |
| 2020/0209673 A1* | 7/2020 | Lee | H10D 86/60 |
| 2020/0273927 A1* | 8/2020 | Oh | H10K 59/121 |
| 2020/0286964 A1* | 9/2020 | Cho | H10K 59/65 |
| 2020/0343321 A1* | 10/2020 | Kim | H10K 30/82 |
| 2020/0365674 A1* | 11/2020 | Jeon | H10K 59/1201 |
| 2020/0395428 A1* | 12/2020 | Baek | H10K 59/131 |

FOREIGN PATENT DOCUMENTS

| | | |
|---|---|---|
| KR | 10-2015-0096021 | 8/2015 |
| KR | 10-2016-0017388 | 2/2016 |
| KR | 10-2016-0099146 | 8/2016 |
| KR | 10-2017-0129318 | 11/2017 |
| KR | 10-1813749 | 1/2018 |
| KR | 10-2018-0026599 | 3/2018 |
| KR | 10-1931176 | 12/2018 |

\* cited by examiner

DISPLAY APPARATUS HAVING TRANSMISSION AREA AND PIXEL AREA, AND METHOD OF MANUFACTURING THE SAME

CROSS-REFERENCE TO RELATED APPLICATION(S)

This is a divisional application of U.S. patent application Ser. No. 17/337,870 filed Jun. 3, 2021, now U.S. Pat. No. 11,943,957, which issued Mar. 26, 2024, the disclosure of which is incorporated herein by reference in its entirety. U.S. patent application Ser. No. 17/337,870 claims priority to and the benefit of Korean Patent Application No. 10-2020-0085677 under 35 U.S.C. § 119, filed in the Korean Intellectual Property Office on Jul. 10, 2020, the entire contents of which are incorporated herein by reference.

BACKGROUND

1. Technical Field

The disclosure relates to a display apparatus and a method of manufacturing the display apparatus, and more specifically, to a display apparatus including an expanded display area enabling images to be displayed even in an area in which a component is arranged, and a method of manufacturing the display apparatus.

2. Description of Related Art

Recently, the use of display apparatuses has diversified. Also, display apparatuses have become thinner and more lightweight, and thus, the use of display apparatuses has expanded.

As display apparatuses are used in various ways, various methods may be used to design the shapes of the display apparatuses. In addition, the number of functions that may be added or linked to display apparatuses is increasing.

SUMMARY

In order to increase the number of functions that may be added or linked to display apparatuses, one or more embodiments include a display apparatus including a display area including a first area in which a component such as a sensor or a camera may be arranged. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a display apparatus may include a substrate including a display area including a transmission area and a pixel area, and a peripheral area adjacent to display area, a display element disposed corresponding to the pixel area, the display element including a pixel electrode, an intermediate layer on the pixel electrode, and an opposite electrode on the intermediate layer, a hydrophobic layer disposed corresponding to the transmission area, and a plurality of fine particles disposed on the hydrophobic layer, the plurality of fine particles and the opposite electrode including a same material.

In an embodiment, the hydrophobic layer may include a fluorine-based molecule including at least one —$CF_3$ group at an end.

In an embodiment, the intermediate layer may include an emission layer on the pixel electrode, and an electron transport layer and an electron injection layer, the electron transport layer and the electron injection layer being disposed between the emission layer and the opposite electrode, and the hydrophobic layer may be disposed directly on the electron transport layer.

In an embodiment, the electron injection layer may include a metal material.

In an embodiment, the intermediate layer may include an emission layer on the pixel electrode, and an electron transport layer and an electron injection layer, the electron transport layer and the electron injection layer being disposed between the emission layer and the opposite electrode, and the hydrophobic layer may be disposed directly on the electron injection layer.

In an embodiment, each of the plurality of fine particles may have a diameter in a range of about 1 nm to about 10 nm.

In an embodiment, in a same area, a volume ratio of the plurality of fine particles may be about 30% or less of a volume ratio of the opposite electrode.

In an embodiment, the display apparatus may further include a capping layer disposed on the opposite electrode corresponding to the display area.

In an embodiment, the capping layer may include an opening corresponding to the transmission area.

In an embodiment, the display apparatus may further include a thin-film encapsulation layer disposed on the capping layer, the thin-film encapsulation layer including at least one inorganic encapsulation layer and at least one organic encapsulation layer, wherein the at least one inorganic encapsulation layer may directly contact the plurality of fine particles and corresponds to the transmission area.

In an embodiment, the capping layer may have a refractive index in a range of about 1.7 to about 1.99.

In an embodiment, the display apparatus may further include an optical functional layer disposed above the hydrophobic layer corresponding to the transmission area, wherein the optical functional layer may have a refractive index in a range of about 1.3 to about 1.6.

In an embodiment, the optical functional layer may directly contact the plurality of fine particles.

In an embodiment, the capping layer may be disposed on the optical functional layer corresponding to the transmission area.

In an embodiment, the opposite electrode may include an opening corresponding to the transmission area.

In an embodiment, the plurality of fine particles may have hydrophilicity.

According to one or more embodiments, a method of manufacturing a display apparatus may include preparing a substrate include a display area and a peripheral area adjacent to the display area, the display area including a transmission area and a pixel area, forming a pixel electrode corresponding to the pixel area, forming an intermediate layer on the pixel electrode corresponding to the pixel area and the transmission area, forming a hydrophobic layer corresponding to the transmission area, and applying an electrode material onto the intermediate layer and the hydrophobic layer in the pixel area and the transmission area.

In an embodiment, the applying of the electrode material may include forming an opposite electrode on the intermediate layer corresponding to the pixel area, and forming a plurality of fine particles on the hydrophobic layer corresponding to the transmission area.

In an embodiment, the forming of the opposite electrode and the forming of the plurality of fine particles may be performed simultaneously.

In an embodiment, the electrode material may have hydrophilicity, and the forming of the opposite electrode may include forming the opposite electrode only in the pixel area by the hydrophobic layer.

Other aspects, features, and advantages of the disclosure will become better understood through the accompanying drawings, the claims and the detailed description.

These general and specific aspects may be implemented by using a system, a method, a computer program, or any combination thereof.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
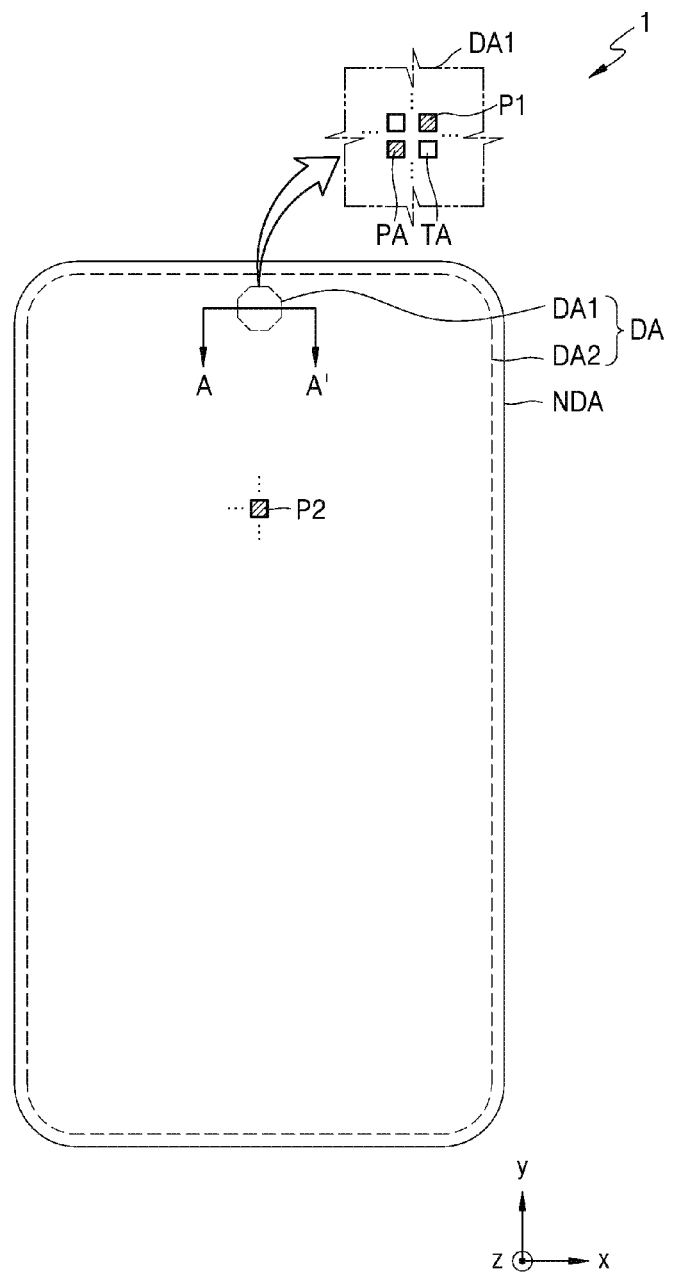
FIG. 1 is a plan view schematically illustrating a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, some embodiments are merely described below, by referring to the figures, to explain aspects of the description. As used herein, the term "and/or" includes any and all combinations of one or more of the associated listed items. In the specification and the claims, the phrase "at least one of" is intended to include the meaning of "at least one selected from the group of" for the purpose of its meaning and interpretation. For example, "at least one of A and B" may be understood to mean "A, B, or A and B."

Because the disclosure may have diverse modified embodiments, some embodiments are illustrated in the drawings and are described in the detailed description. Effects and characteristics of the disclosure, and a method of accomplishing these will be apparent when referring to embodiments described with reference to the drawings. The disclosure may, however, be embodied in many different forms and should not be construed as being limited to the embodiments set forth herein.

One or more embodiments of the disclosure will be described below in more detail with reference to the accompanying drawings. Those components that are the same are rendered the same reference numeral regardless of the figure number, and redundant explanations may be omitted.

It will be understood that although the terms "first," "second," and the like may be used herein to describe various elements, these elements should not be limited by these terms. These terms are only used to distinguish one element from another.

An expression used in the singular form encompasses the expression of the plural form, unless it has a clearly different meaning in the context.

It will be further understood that the terms "comprises," "comprising," "include," and "including" used herein specify the presence of stated features or elements, but do not preclude the presence or addition of one or more other features or elements.

It will be understood that when a layer, region, or element is referred to as being "formed on" another layer, area, or element, it may be directly or indirectly formed on the other layer, region, or element. For example, for example, intervening layers, regions, or elements may be present.

It will be understood that when a layer, region, or component is referred to as being connected to another layer, region, or component, it may be directly or indirectly connected to the other layer, region, or component. For example, for example, intervening layers, regions, or components may be present. In the following embodiments, it will be understood that when a layer, region, or element is referred to as being "electrically connected to" or "electrically coupled to" another layer, region, and element, it may be directly or indirectly electrically connected or coupled to the other layer, region, or element. For example, for example, intervening layers, regions, or elements may be present.

The x-axis, the y-axis, and the z-axis are not limited to three axes of the rectangular coordinate system and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Sizes of elements in the drawings may be exaggerated for convenience of explanation. In other words, because sizes and thicknesses of components in the drawings are arbitrarily illustrated for convenience of explanation, the following embodiments are not limited thereto.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined in the specification.

Hereinafter, although an organic light-emitting display apparatus is described as an example of a display apparatus 1 according to an embodiment, a display apparatus according to the disclosure is not limited thereto. In another embodiment, the display apparatus 1 according to the disclosure may include an inorganic light-emitting display apparatus, an inorganic electroluminescence (EL) display apparatus, or a quantum dot light-emitting display apparatus. For example, an emission layer of a display element provided in the display apparatus 1 may include an organic material, an inorganic material, a quantum dot, an organic material and a quantum dot, or an inorganic material and a quantum dot.

FIG. 1 is a plan view schematically illustrating a display apparatus 1 according to an embodiment.

Referring to FIG. 1, the display apparatus 1 may include a display area DA, and a peripheral area NDA outside the display area DA. The display area DA may include a first area DA1 defined as an auxiliary display area or a component area, and a second area DA2 defined as a main display area at least partially surrounding the first area DA1. For example, the first area DA1 and the second area DA2 may display images individually or together.

The peripheral area NDA may be a non-display area in which no display elements are arranged. The display area DA may be entirely surrounded by the peripheral area NDA.

FIG. 1 illustrates that one first area DA1 is located in the second area DA2. In another embodiment, the display apparatus 1 may include at least two first areas DA1, and the at least two first areas DA1 may have different shapes and sizes. When seen in a direction substantially perpendicular to the upper surface of the display apparatus 1 (or in a plan view), the first area DA1 may have various shapes. For example, the first area DA1 may have a polygonal shape such as a quadrangular, hexagonal, or octagonal shape, a circular shape, an oval shape, a stellate shape, or a diamond shape. When seen in a direction substantially perpendicular to the upper surface of the display apparatus 1, FIG. 1 illustrates that the first area DA1 is arranged in the upper center (+y direction) of the display area DA including corners each having a substantially rounded rectangular shape, but the first area DA1 may also be arranged at a side of the display area DA, for example, the upper right or upper left of the display area DA.

The first area DA1 may include a pixel area PA and a transmission area TA. Pixel areas PA and transmission areas TA may be provided. The pixel areas PA and the transmission areas TA may be alternately arranged. Pixels may be arranged in the pixel area PA, and pixels are not arranged in the transmission area TA. The transmission area TA may be an area in which the arrangement of elements constituting a display layer DSL (see FIG. 2) is minimized. The transmission area TA may transmit light through a substrate 100.

First pixels P1 may be arranged in the pixel area PA of the first area DA1. Each of the first pixels P1 refers to a sub-pixel and may be implemented by a display element such as an organic light-emitting diode OLED. The first pixel P1 may emit, for example, red, green, blue, or white light.

The transmission area TA may surround the first pixels P1. As another example, the transmission areas TA may be alternatively arranged with the first pixels P1.

The first area DA1 may include the transmission area TA, and thus the resolution of the first area DA1 may be lower than that of the second area DA2. For example, the resolution of the first area DA1 may be about ½, ⅜, ⅓, ¼, ⅖, ⅛, ⅑, or ¹⁄₁₆ of that of the second area DA2. For example, the resolution of the first area DA1 may be about 200 ppi or about 100 ppi, and the resolution of the second area DA2 may be about 400 ppi or greater.

Second pixels P2 may be arranged in the second area DA2. Each of the second pixels P2 refers to a sub-pixel and may be implemented by a display element such as an organic light-emitting diode OLED. The second pixel P2 may emit, for example, red, green, blue, or white light.

The display apparatus 1 may provide images through the first area DA1 and the second area DA2.

As described below with reference to FIG. 2, a component 20, which is an electronic element, may be arranged below a display panel 10 in correspondence with the first area DA1.

In case that light is transmitted through the first area DA1, the display apparatus 1 according to an embodiment may have a light transmittance of about 10% or greater. Specifically, the light transmittance may be about 40% or greater, about 25% or greater, about 50% or greater, about 85% or greater, or about 90% or greater.

Figure 2:
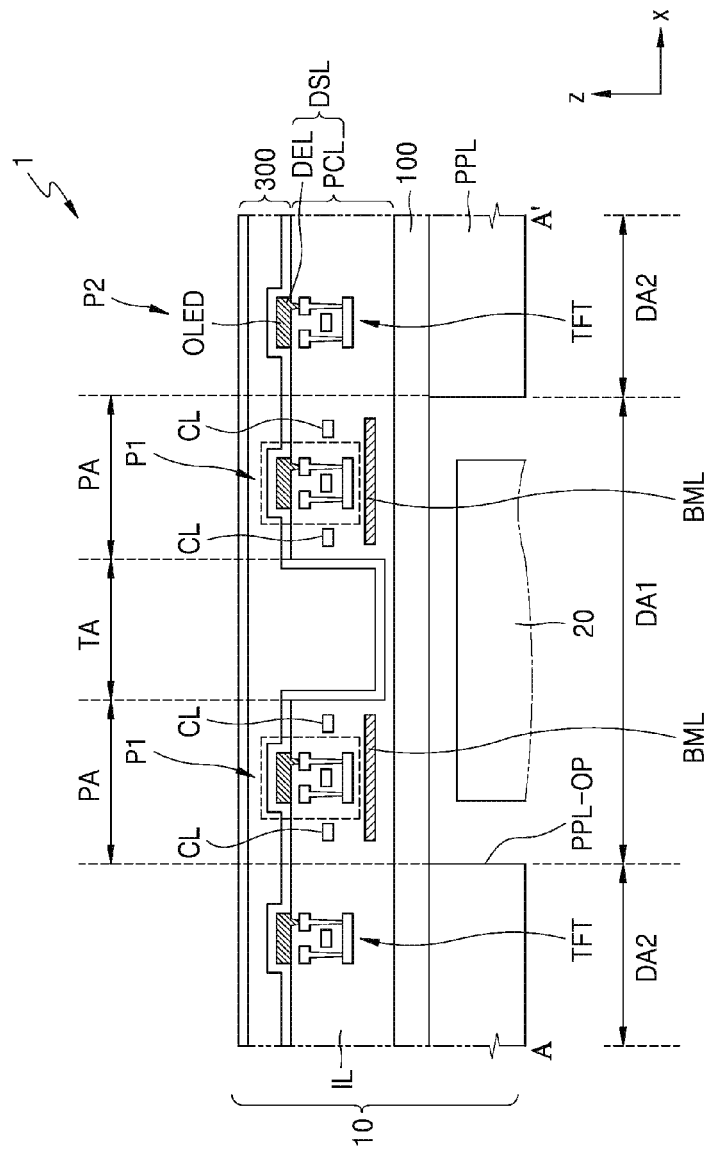
FIG. 2 is a cross-sectional view taken along line A-A' and schematically illustrating a portion of a display apparatus, according to an embodiment.

FIG. 2 is a cross-sectional view schematically illustrating a portion of the display apparatus 1, according to an embodiment.

Referring to FIG. 2, the display apparatus 1 may include the display panel 10, and the component 20 overlapping the display panel 10. A cover window (not illustrated) may be further arranged above the display panel 10 to protect the display panel 10.

The display panel 10 may include the substrate 100, the display layer DSL, a thin-film encapsulation layer 300, and a panel protection layer PPL arranged below the substrate 100. Although not illustrated, a touch sensing layer and/or a polarization layer may be further located on the thin-film encapsulation layer 300.

The substrate 100 may include an insulating material such as glass, quartz, and a polymer resin. The substrate 100 may be a rigid or flexible substrate that is bendable, foldable, or rollable. In an embodiment, the substrate 100 may have a multilayer structure and may include at least one organic layer and at least one inorganic layer.

The display layer DSL may include a pixel circuit layer PCL including a thin-film transistor TFT, a display element layer DEL including an organic light-emitting diode OLED as a display element, and a sealing member such as the thin-film encapsulation layer 300 or a sealing substrate (not illustrated). The first and second pixels P1 and P2 including the thin-film transistor TFT and the organic light-emitting diode OLED electrically connected thereto may be arranged in the display layer DSL corresponding to the display area DA.

The first pixel P1 including the thin-film transistor TFT and the organic light-emitting diode OLED electrically connected thereto may be arranged in the first area DA1. Although FIG. 2 illustrates that a single first pixel P1 is included in the pixel area PA, the first pixels P1 may be included in each pixel area PA.

The transmission area TA including no display elements may be located between the pixel areas PA of the first area DA1. The transmission area TA may be an area through which light or a signal emitted from the component 20 or light or a signal incident onto the component 20 is transmitted. At least a portion of an insulating layer IL corresponding to the transmission area TA may be removed, and other portions thereof may be arranged on the transmission area TA. As described above, the light transmittance of the transmission area TA may be improved by removing a portion of the insulating layer IL corresponding to the transmission area TA.

The component 20 may be located in correspondence with the first area DA1. The component 20 may be an electronic element that uses light or sound. For example, the component 20 may include a sensor (e.g., an infrared sensor) configured to receive and use light, a sensor configured to output and detect light or sound to measure a distance, a sensor configured to recognize a fingerprint, a small lamp configured to output light, a speaker configured to output sound, a camera including an imaging device, and the like. In case that the component 20 is an electronic element that uses light, the component 20 may use light of various wavelength bands, such as visible light, infrared light, and ultraviolet light. For example, the component 20 may include a solar cell, a flash, an illumination sensor, a proximity sensor, an iris sensor, or a camera. To reduce the limiting of the function of the component 20, the transmission area TA may be arranged in the first area DA1. The transmission area TA may transmit light and/or sound output from the component 20 to the outside or traveling from the outside toward the component 20.

In an embodiment, components 20 may be arranged in the first area DA1. The components 20 may have different functions. For example, the components 20 may include at least two components selected from a camera (or imaging device), a solar cell, a flash, a proximity sensor, an illumination sensor, and an iris sensor.

A back metal layer BML may be arranged in the first area DA1. The back metal layer BML may be arranged to correspond to the pixel area PA. The back metal layer BML may prevent external light, for example, light emitted from the component 20, from reaching the first pixel P1. The back metal layer BML may prevent light from being reflected or diffracted while the external light passes between lines CL. Therefore, image distortion (e.g., flare, haze, etc.) in the first area DA1 may be prevented.

In an embodiment, a constant voltage or a signal may be applied to the back metal layer BML to prevent damage to a pixel circuit PC (see FIG. 3) due to electrostatic discharge. In another embodiment, different voltages may be applied to back metal layers BML arranged to correspond to different pixel areas PA.

The thin-film encapsulation layer 300 may include at least one inorganic encapsulation layer and at least one organic encapsulation layer. The thin-film encapsulation layer 300 may be arranged on the transmission area TA. In the embodiment, the thin-film encapsulation layer 300 may be used as the encapsulation member for sealing the display element layer DEL, but the disclosure is not limited thereto. For example, a sealing substrate bonded to the substrate 100 by a sealant or frit may be used as a member for sealing the display element layer DEL.

The panel protection layer PPL may be attached to a lower portion of the substrate 100 to support and protect the substrate 100. The panel protection layer PPL may include an opening PPL-OP corresponding to the first area DA1. The panel protection layer PPL may include the opening PPL-OP, and thus the light transmittance of the first area DA1 may be improved. The panel protection layer PPL may include polyethylene terephthalate or polyimide. For example, an area of the opening PPL-OP may be less than that of the first area DA1.

The cover window (not illustrated) may be arranged above the display panel 10 to protect the display panel 10.

Figure 3:
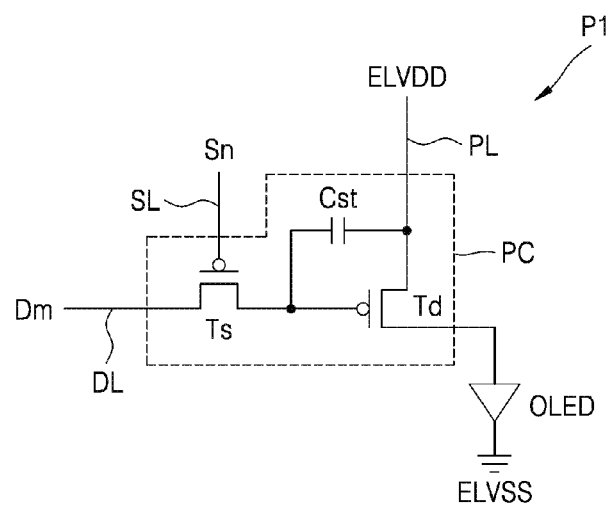
FIG. 3 is a schematic equivalent circuit diagram of a pixel in a display apparatus, according to an embodiment.

FIG. 3 is an equivalent circuit diagram of the first pixel P1 in the display apparatus 1, according to an embodiment.

Referring to FIG. 3, the first pixel P1 may include the pixel circuit PC connected to a driving voltage line PL, a scan line SL, and a data line DL, and the organic light-emitting diode OLED connected to the pixel circuit PC.

The pixel circuit PC may include a driving thin-film transistor Td, a switching thin-film transistor Ts, and a storage capacitor Cst. The switching thin-film transistor Ts may be electrically connected to the scan line SL and the data line DL and may be configured to transmit, to the driving thin-film transistor Td, a data signal Dm input through the data line DL according to a scan signal Sn input through the scan line SL.

The storage capacitor Cst may be electrically connected to the switching thin-film transistor Ts and the driving voltage line PL and may be configured to store a voltage corresponding to a difference between a voltage received from the switching thin-film transistor Ts and a first power supply voltage (e.g., a driving voltage) ELVDD supplied to the driving voltage line PL.

The driving thin-film transistor Td may be electrically connected to the driving voltage line PL and the storage capacitor Cst and may be configured to control a driving current flowing from the driving voltage line PL to the organic light-emitting diode OLED according to a voltage value stored in the storage capacitor Cst. The organic light-emitting diode OLED may emit light having a predetermined luminance according to a second power supply voltage (e.g., a common voltage) ELVSS and the driving current.

FIG. 3 illustrates a case in which the pixel circuit PC includes two thin-film transistors and a storage capacitor, but the disclosure is not limited thereto. In another embodiment, the pixel circuit PC may include seven thin-film transistors and a storage capacitor. In another embodiment, the pixel circuit PC may include two or more storage capacitors.

In an embodiment, the second pixel P2 and the first pixel P1 may have the same or different pixel circuit structure(s). For example, the first pixel P1 may include a pixel circuit PC including two thin-film transistors and a storage capacitor, and the second pixel P2 may include a pixel circuit PC including seven thin-film transistors and a storage capacitor.

Figure 4:
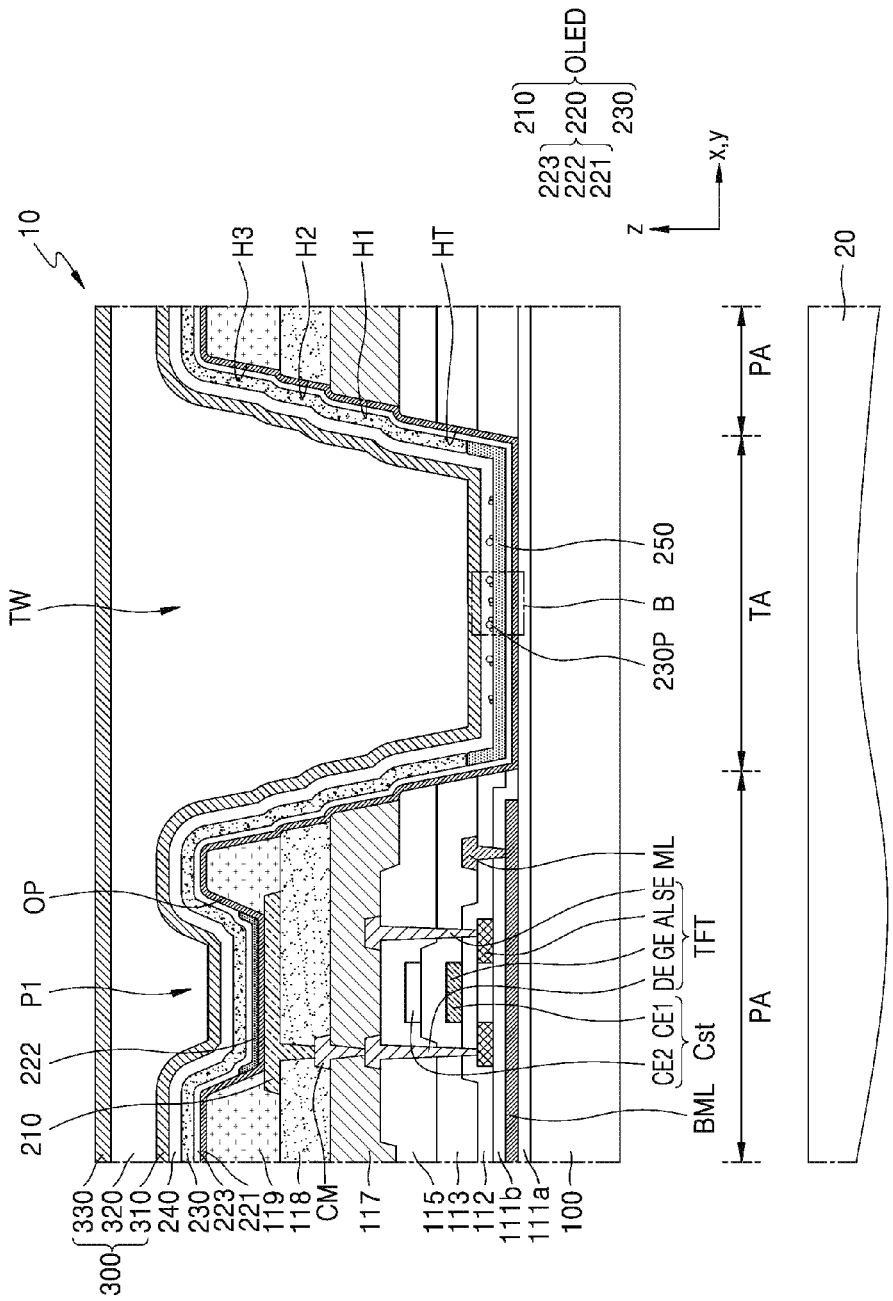
FIG. 4 is a cross-sectional view schematically illustrating a portion of a first area in a display apparatus, according to an embodiment.
Figure 5:
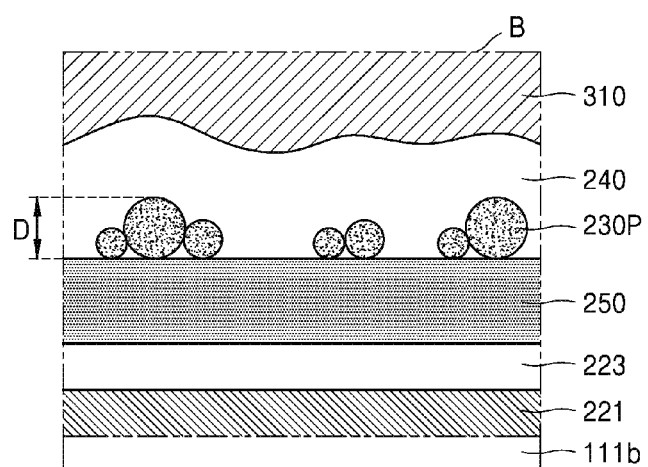
FIG. 5 is a schematic enlarged cross-sectional view of portion B of FIG. 4.
Figure 7:
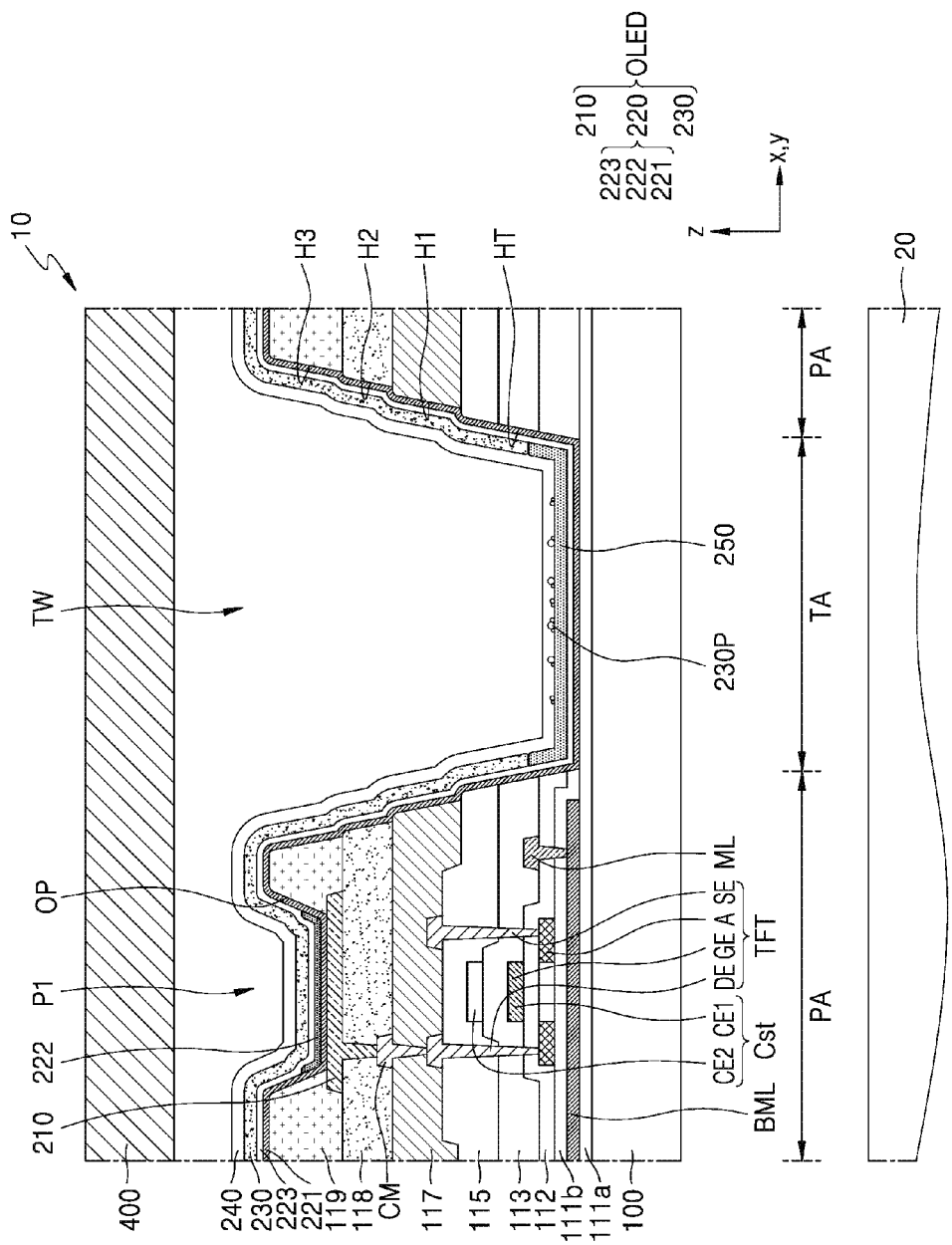
FIGS. 7 and 8 are cross-sectional views schematically illustrating modifications of FIG. 4.
Figure 8:
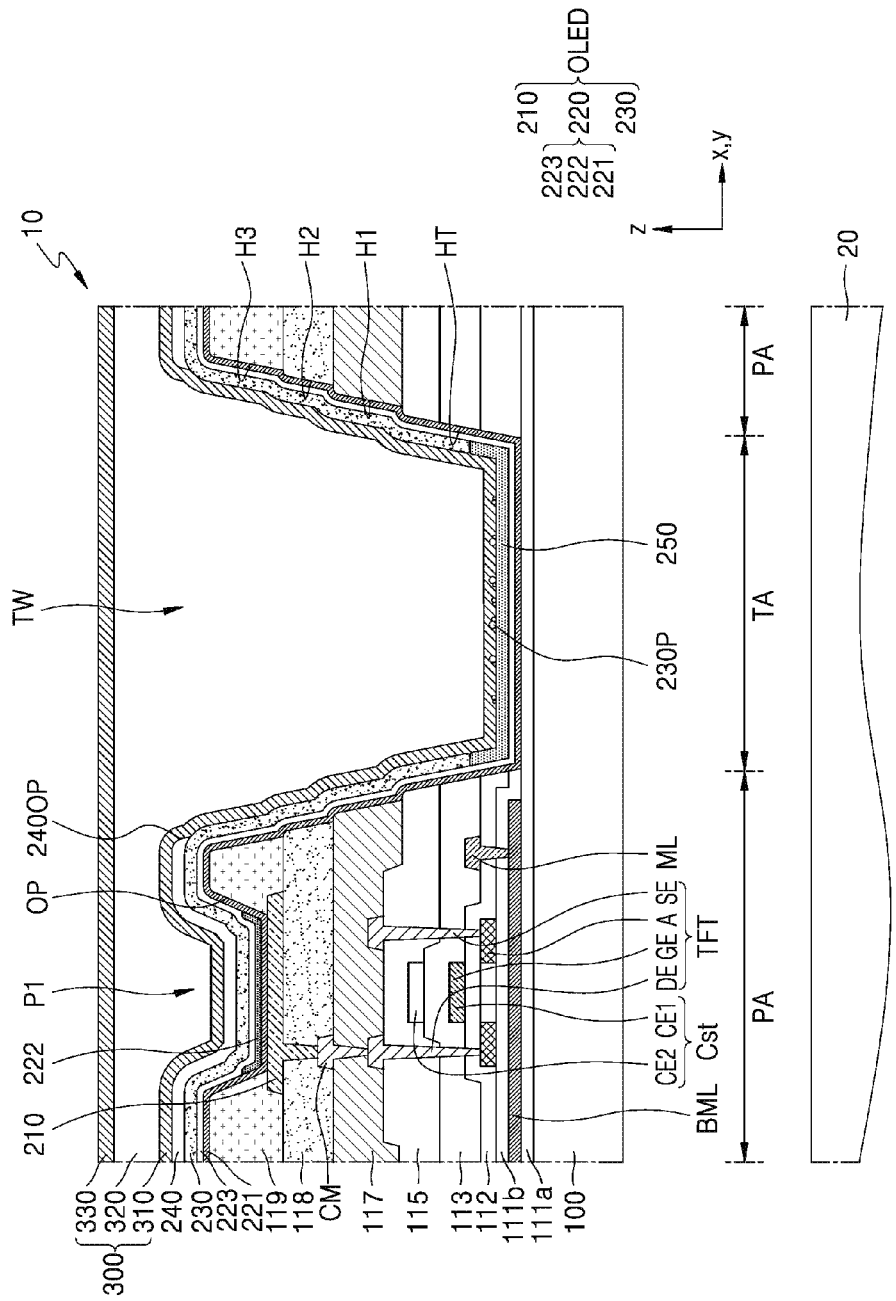

FIG. 4 is a schematic cross-sectional view schematically illustrating the portion of the first area DA1 in the display apparatus 1, according to an embodiment, and FIG. 5 is a schematic enlarged cross-sectional view of portion B of FIG. 4. FIGS. 7 and 8 are schematic cross sectional views of modifications of FIG. 4.

Referring to FIG. 4, a substrate 100 may include a polymer resin. Examples of the polymer resin may include polyethersulfone, polyacrylate, polyetherimide, polyethylene naphthalate, polyethylene terephthalate, polyphenylene sulfide, polyarylate, polyimide, polycarbonate, and cellulose acetate propionate. In an embodiment, the substrate 100 may include at least one organic base layer including an organic material, and at least one inorganic base layer.

A barrier layer 111a may be arranged on the substrate 100. In an embodiment, as illustrated in FIG. 4, the barrier layer 111a may be arranged on the entire surface of the first area DA1 over the pixel area PA and the transmission area TA. In another embodiment, the barrier layer 111a may not be arranged in the transmission area TA. The barrier layer 111a may reduce or block penetration of foreign matter, moisture, or external air from the bottom of the substrate 100 and may provide a flat surface on the substrate 100. The barrier layer 111a may include an inorganic material such as oxide or nitride, or an organic or inorganic composite material and may have a single or multilayer structure. For example, the barrier layer 111a may include silicon nitride ($SiN_x$), silicon oxide ($SiO_x$), and/or silicon oxynitride (SiON).

The first pixel P1 may correspond to the pixel area PA. Although FIG. 4 illustrates only the stacked structure of the first pixel P1 in the first area DA1, the stacked structure of the second pixel P2 in the second area DA2 may also be substantially identical to the stacked structure illustrated in FIG. 4. However, in an embodiment, the back metal layer BML may not be arranged below the second pixel P2 in the second area DA2.

The pixel area PA may include insulating layers, a thin-film transistor TFT, a storage capacitor Cst, and an organic light-emitting diode OLED. The transmission area TA may include a transmission hole HT that is an opening formed by removing some of the insulating layers to secure transmittance.

The back metal layer BML may be arranged below or under the thin-film transistor TFT of the first pixel P1 and may overlap the thin-film transistor TFT. As illustrated in FIG. 4, after the barrier layer 111a is formed on the substrate 100, the back metal layer BML may be arranged on the barrier layer 111a or may be directly arranged on the substrate 100.

In another embodiment, the back metal layer BML overlapping the thin-film transistor TFT may be omitted. In another embodiment, multiple back metal layers BML may be provided in the first area DA1, and some of the back metal layers BML may be arranged on different layers. The back metal layer BML may be arranged below the first pixel P1 to prevent the thin-film transistor TFT, arranged in the first pixel P1, from being damaged or deteriorated by the component 20.

The back metal layer BML may be connected through a contact hole to a conductive layer ML arranged on another layer. The back metal layer BML may receive a constant voltage or a signal from the conductive layer ML. For example, the back metal layer BML may receive a driving voltage ELVDD, an initialization voltage, or a scan signal. Because the back metal layer BML receives a constant voltage or a signal, the probability of occurrence of electrostatic discharge may be significantly reduced. In another embodiment, all the back metal layers BML may not receive an electrical signal. In another embodiment, in case that the back metal layers BML are provided, various modifications may be made. For example, at least one of the back metal layers BML may be electrically isolated, and the others thereof may receive an electrical signal.

The back metal layer BML may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and/or copper (Cu). The back metal layer BML may include a single layer or multiple layers including the above-described material.

A buffer layer 111b may be arranged on the back metal layer BML. The thin-film transistor TFT may be arranged above the buffer layer 111b. The thin-film transistor TFT may include a semiconductor layer AL, a gate electrode GE, and a source electrode SE and a drain electrode DE that are electrode layers. The thin-film transistor TFT may be electrically connected to the organic light-emitting diode OLED and may drive the organic light-emitting diode OLED.

The semiconductor layer AL may be arranged on the buffer layer 111b and may include polysilicon. In another embodiment, the semiconductor layer AL may include amorphous silicon. In another embodiment, the semiconductor layer AL may include oxide of at least one selected from the group consisting of indium (In), gallium (Ga), stannum (Sn), zirconium (Zr), vanadium (V), hafnium (Hf), cadmium (Cd), germanium (Ge), chromium (Cr), titanium (Ti), and zinc (Zn). The semiconductor layer AL may include a channel region, and a source region and a drain region doped with impurities.

The semiconductor layer AL may overlap the back metal layer BML with the buffer layer 111b therebetween. In an embodiment, a width of the semiconductor layer AL may be less than that of the back metal layer BML. Therefore, when projected in a direction perpendicular to the substrate 100 (or in a plan view), the entire semiconductor layer AL may overlap the back metal layer BML. In another embodiment, the back metal layer BML may correspond to the pixel area PA. In this case, multiple semiconductor layers AL may overlap the back metal layer BML.

A first gate insulating layer 112 may cover or overlap the semiconductor layer AL. The first gate insulating layer 112 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The first gate insulating layer 112 may be a single layer or multiple layers including the above-described inorganic insulating material.

The gate electrode GE may be arranged on the first gate insulating layer 112 and overlap the semiconductor layer AL. The gate electrode GE may include molybdenum (Mo), aluminum (Al), copper (Cu), titanium (Ti), or the like and may include a single layer or multiple layers. For example, the gate electrode GE may be a single Mo layer.

A second gate insulating layer 113 may cover or overlap the gate electrode GE. The second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The second gate insulating layer 113 may be a single layer or multiple layers including the above-described inorganic insulating material.

A second electrode CE2 of the storage capacitor Cst may be arranged above or on the second gate insulating layer 113. In the pixel circuit PC according to the embodiment, the second electrode CE2 may overlap the gate electrode GE arranged therebelow. The gate electrode GE and the second electrode CE2 overlapping each other with the second gate insulating layer 113 therebetween may form (or constitute) the storage capacitor Cst. The gate electrode GE may be a first electrode CE1 of the storage capacitor Cst.

The second electrode CE2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu) and may include a single layer or multiple layers including the above-described material.

An interlayer insulating layer 115 may cover or overlap the second electrode CE2. The interlayer insulating layer 115 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

In the embodiment, the buffer layer 111b, the first gate insulating layer 112, the second gate insulating layer 113, the interlayer insulating layer 115, which are arranged on the barrier layer 111a, may be collectively defined as an inorganic insulating layer IL.

The source electrode SE and the drain electrode DE may be arranged on the interlayer insulating layer 115. The source electrode SE and the drain electrode DE may each include a conductive material including molybdenum (Mo), aluminum (Al), copper (Cu), titanium (Ti), or the like and may each include a single layer or multiple layers including the above-described material. For example, the source electrode SE and the drain electrode DE may each have a multilayer structure of Ti/Al/Ti.

A first organic insulating layer 117 may cover or overlap the source electrode SE and the drain electrode DE. The first organic insulating layer 117 may include a flat upper surface so that a pixel electrode 210 arranged thereabove may be flat.

A second organic insulating layer 118 may be arranged on the first organic insulating layer 117. A contact metal CM may be between the first organic insulating layer 117 and the second organic insulating layer 118. The contact metal CM may electrically connect the drain electrode DE to the pixel electrode 210 through contact holes formed in the first organic insulating layer 117 and the second organic insulating layer 118.

The first and second organic insulating layers 117 and 118 may include a single layer or multiple layers including an organic or inorganic material. The first and second organic insulating layers 117 and 118 may each include a general-purpose polymer (e.g., benzocyclobutene (BCB), polyimide, hexamethyldisiloxane (HMDSO), polymethylmethacrylate (PMMA), or polystyrene (PS)), a polymer derivative including a phenol-based group, an acryl-based polymer, an imide-based polymer, an aryl ether-based polymer, an amide-based polymer, a fluorine-based polymer, a p-xylene-based polymer, a vinyl alcohol-based polymer, and any blend thereof. The first and second organic insulating layers 117 and 118 may each include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The organic light-emitting diode OLED may be arranged on the second organic insulating layer 118. The organic light-emitting diode OLED may include the pixel electrode 210, an intermediate layer 220 including an emission layer 222, and an opposite electrode 230. The pixel electrode 210 may include conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In another embodiment, the pixel electrode 210 may further include a layer including ITO, IZO, ZnO, or $In_2O_3$ above and/or below the reflective layer. For example, the pixel electrode 210 may have a stacked structure of ITO/Ag/ITO.

A third organic insulating layer 119 corresponding to a pixel defining layer may cover or overlap each edge of the pixel electrode 210. The third organic insulating layer 119 may include an opening OP overlapping the pixel electrode 210 and defining an emission area of the pixel (e.g., the first pixel P1). The opening OP may be defined as an emission area in the first pixel P1. The third organic insulating layer 119 may increase a distance between the edge of the pixel electrode 210 and the opposite electrode 230 disposed above the pixel electrode 210, thereby preventing arcs or the like from occurring at the edge of the pixel electrode 210. The third organic insulating layer 119 may include an organic insulating material such as polyimide, polyamide, an acrylic resin, benzocyclobutene, hexamethyldisiloxane (HMDSO), and a phenol resin and may be formed by spin coating or the like.

The third organic insulating layer 119 may include a third hole H3 corresponding to the transmission area TA. The third hole H3 may overlap at least a part of the transmission hole HT. The first to third holes H1, H2, and H3 may correspond to the transmission area TA, and thus the light transmittance of the transmission area TA may be improved. The intermediate layer 220 and the opposite electrode 230, which will be described below, may be arranged on inner walls of the first to third holes H1, H2, and H3.

A first common layer 221 may overlap the third organic insulating layer 119. The first common layer 221 may be a single layer or multiple layers. The first common layer 221 may include a hole transport layer (hereinafter "HTL") having a single layer structure. For example, the first common layer 221 may include a hole injection layer (hereinafter "HIL") and an HTL.

An emission layer 222 formed to correspond to the pixel electrode 210 may be arranged on the first common layer 221. The emission layer 222 may include a high or low molecular weight material and may emit red, green, blue, or white light.

A second common layer 223 may be arranged on the emission layer 222. The second common layer 223 may be a single layer or multiple layers. The second common layer 223 may include an electron transport layer (hereinafter "ETL") and/or an electron injection layer (hereinafter "EIL"). In an embodiment, the ETL may be arranged on the emission layer 222, and the EIL may be arranged on the ETL.

The first common layer 221 and the second common layer 223 may be integral with each other to commonly correspond to the first and second pixels P1 and P2 (see FIG. 2) included in the first area DA1 and the second area DA2. In another embodiment, the first common layer 221 and/or the second common layer 223 may be omitted.

The opposite electrode 230 may be arranged above the second common layer 223. The opposite electrode 230 may include a conductive material having a low work function. For example, the opposite electrode 230 may include a transparent (or semi-transparent) layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. As another example, the opposite electrode 230 may further include a layer such as an ITO, IZO, ZnO, or $In_2O_3$ layer on the transparent or semi-transparent layer including the above-described material. The opposite electrode 230 may be integrally formed in the display area DA.

In an embodiment, the opposite electrode 230 is not provided in the transmission area TA. The opposite electrode 230 will be described below in detail.

A capping layer 240 may be formed on the opposite electrode 230 so as to improve the light extraction rate of light emitted from the organic light emitting diode OLED. In an embodiment, the capping layer 240 may have a refractive index of about 1.7 to about 1.99 and may have a thickness of about 300 Å to about 1,000 Å. The capping layer 240 may include a metal material, for example, lithium fluoride (LiF). For example, the capping layer 240 may include an inorganic insulating material such as silicon nitride and/or an organic insulating material. In an embodiment, the capping layer 240 may be omitted.

The organic light-emitting diode OLED may be sealed by the thin-film encapsulation layer 300. The thin-film encapsulation layer 300 may be arranged on the opposite electrode 230. In case that the capping layer 240 is formed on the opposite electrode 230, the thin-film encapsulation layer 300 may be arranged on the capping layer 240. The thin-film encapsulation layer 300 may prevent external moisture or foreign matter from penetrating into the organic light-emitting diode OLED.

The thin-film encapsulation layer 300 may include at least one inorganic encapsulation layer and at least one organic encapsulation layer. In this regard, FIG. 4 illustrates the thin-film encapsulation layer 300 having a structure in which a first inorganic encapsulation layer 310, an organic encapsulation layer 320, and a second inorganic encapsulation layer 330 are stacked. In another embodiment, the number of organic encapsulation layers, the number of inorganic encapsulation layers, and the stacking order may be changed.

The first inorganic encapsulation layer 310, the organic encapsulation layer 320, and the second inorganic encapsulation layer 330 may be arranged in the entire display area DA and may be integral with each other to cover or overlap the first area DA1 and the second area DA2. Therefore, the first inorganic encapsulation layer 310, the organic encapsulation layer 320, and the second inorganic encapsulation layer 330 may also be arranged in the transmission area TA.

In another embodiment, the organic encapsulation layer 320 may be integrally formed to cover or overlap the first area DA1 and the second area DA2 but may not be present in the transmission area TA. For example, the organic encapsulation layer 320 may include an opening corresponding to the transmission area TA. The first inorganic encapsulation layer 310 and the second inorganic encapsulation layer 330 may contact each other in the transmission hole HT.

In another embodiment, as illustrated in FIG. 7, the display apparatus 1 according to an embodiment may not include a thin-film encapsulation layer, but instead may include an encapsulation substrate 400 as an encapsulation member. The encapsulation substrate 400 may include an insulating material such as glass, quartz, or a polymer resin. Although not illustrated, the encapsulation substrate 400 may be bonded to the substrate 100 through a sealant (e.g., a frit, etc.) arranged in the peripheral area NDA. Such a structure may prevent external moisture or foreign matter from penetrating into the organic light-emitting diode OLED.

A transmission window TW may be provided in the transmission area TA. The transmission window TW may transmit light and/or sound output from the component 20 to the outside or traveling toward the component 20. The transmission window TW may be implemented or formed through the transmission hole HT and the first to third holes H1, H2, and H3 formed in the inorganic insulating layer IL and the first to third organic insulating layers 117, 118, and 119.

At least a portion of the barrier layer 111*a* may be arranged in the transmission area TA. The barrier layer 111*a* arranged in the transmission area TA may prevent outgas, generated during a process of manufacturing the substrate 100 including an organic material, from penetrating into the display layer DSL. In another embodiment, the barrier layer 111*a* may not be arranged in the transmission area TA. In this case, the transmission hole HT, which will be described below, may extend to the barrier layer 111*a*, and the substrate 100 may be exposed through the transmission hole HT.

The inorganic insulating layer IL may include a transmission hole HT that is an opening corresponding to the transmission area TA. In FIG. 4, the transmission hole HT may expose the barrier layer 111*a*. The transmission hole HT may be formed by overlapping openings of the buffer layer 111*b*, the first gate insulating layer 112, the second gate insulating layer 113, and the interlayer insulating layer 115, which correspond to the transmission area TA. The openings may be separately formed through separate processes or may be simultaneously formed through the same process. In case that the openings are formed through the separate processes, a staircase-shaped stepped surface may be formed on the inner surface of the transmission hole HT.

The first and second organic insulating layers 117 and 118 may respectively include a first hole H1 and a second hole H2 in correspondence with the transmission area TA. The first hole H1 and the second hole H2 may overlap at least a part of the transmission hole HT. The third organic insulating layer 119 may include the third hole H3 in correspondence with the transmission area TA. The third hole H3 may correspond to the transmission hole HT.

The width of the third hole H3 in a direction (e.g., the x-direction) may be greater than that of the second hole H2, the width of the second hole H2 may be greater than that of the first hole H1, and the width of the first hole H1 may be greater than that of the transmission hole HT. However, the disclosure is not limited thereto, and at least one of the first to third organic insulating layers 117, 118, and 119 may cover or overlap the inner surface of the transmission hole HT. The width of at least one of the first to third holes H1, H2, and H3 may be less than that of the transmission hole HT.

The emission layer 222 of the intermediate layer 220 may be formed only in the pixel area PA in correspondence with each pixel (e.g., the first pixel), but the first common layer 221 and the second common layer 223 may be arranged in the transmission area TA. The first common layer 221 and the second common layer 223 may be integral with each other over the entire display area DA.

Figure 9:
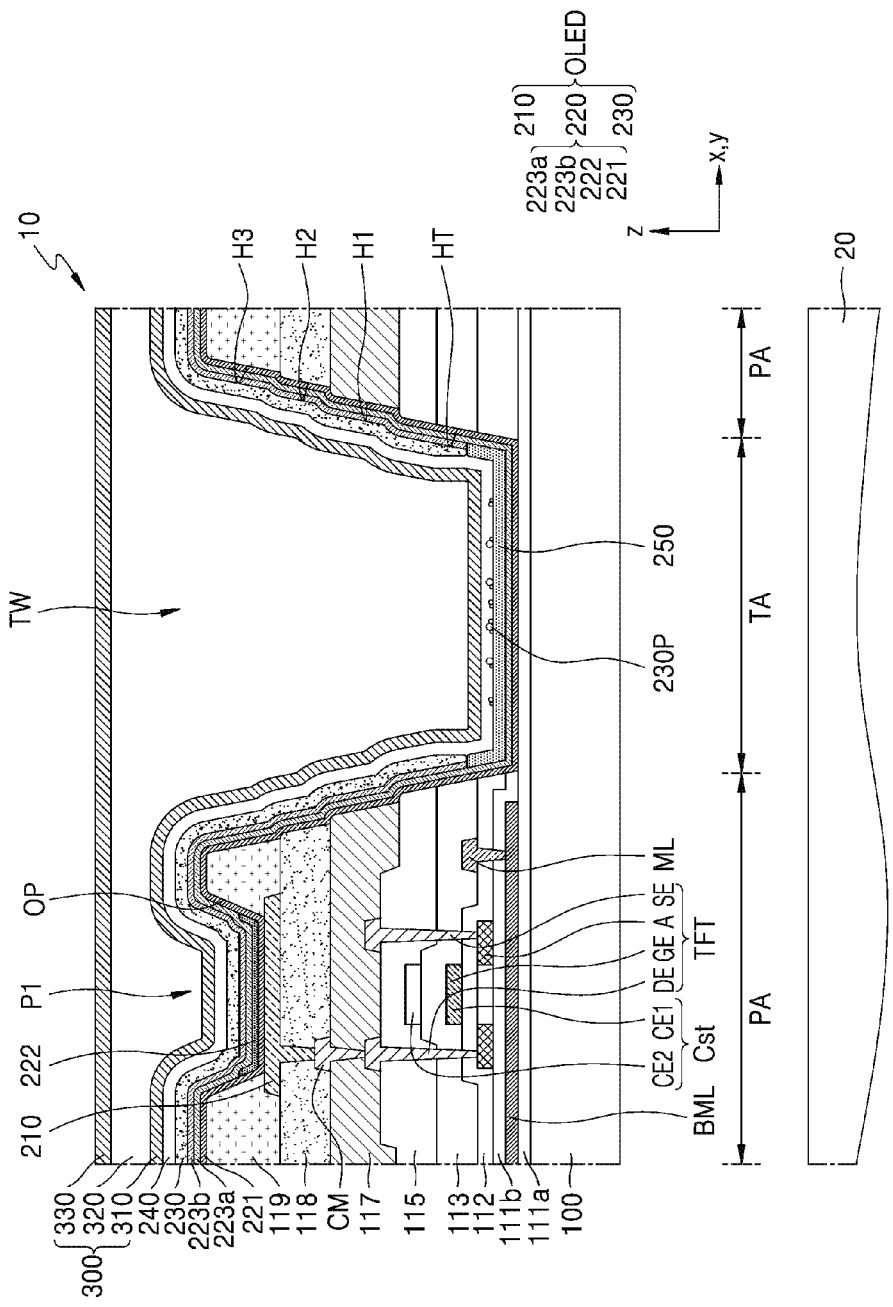
FIGS. 9 and 10 are cross-sectional views schematically illustrating a portion of a display apparatus, according to an embodiment.
Figure 10:
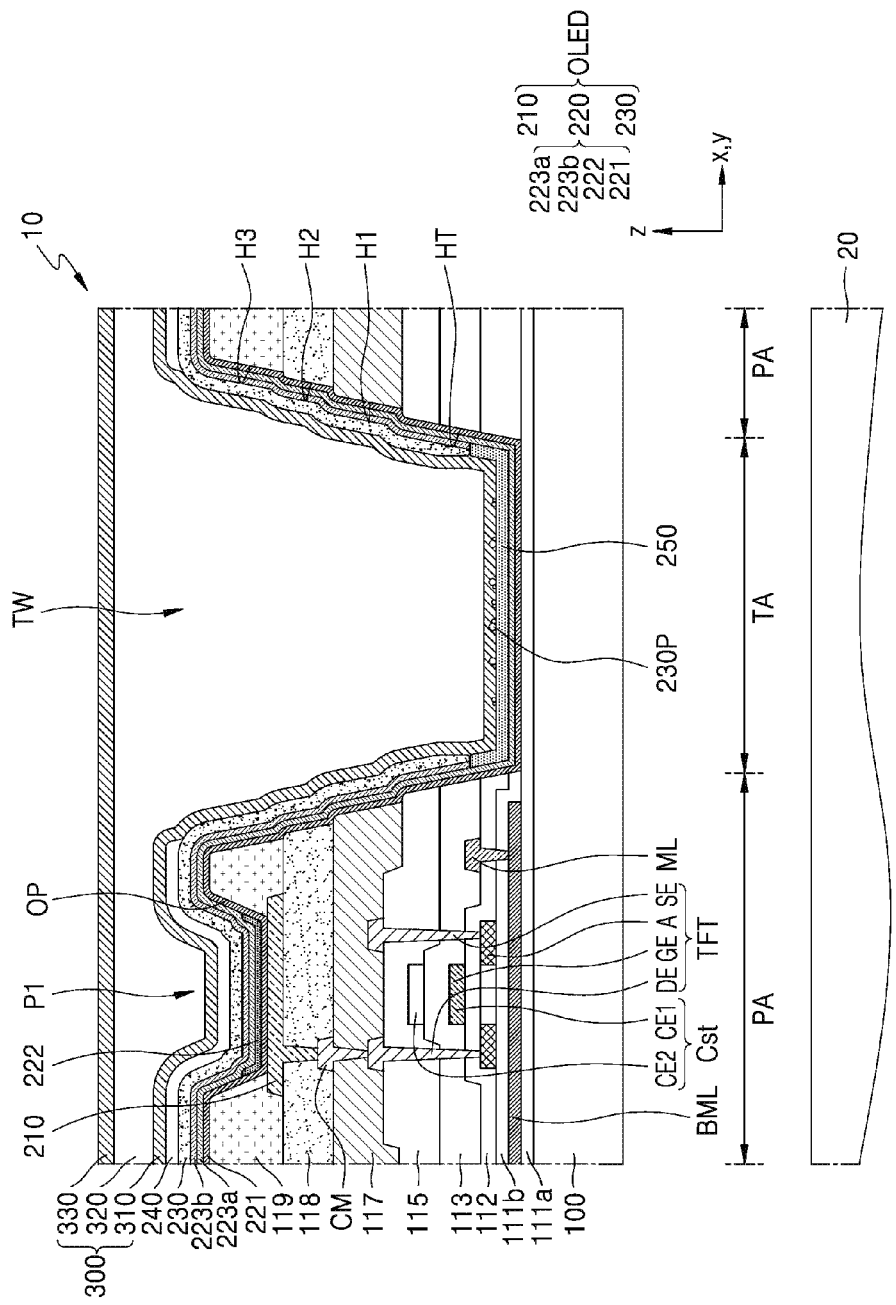

A hydrophobic layer 250 may be arranged on the second common layer 223 of the transmission area TA. In an embodiment, the hydrophobic layer 250 may be arranged on the EIL of the second common layer 223 (see the EIL 223*a* of FIG. 9). In another embodiment, the hydrophobic layer 250 may be arranged on the ETL (see the ETL 223*b* of FIG. 9), as illustrated in FIG. 9 or 10, which will be described below.

The hydrophobic layer 250 may include a fluorine-based organic material. For example, the hydrophobic layer 250 may include a perfluorine-based material such as perfluorooctyl-trichlorosilane or perfluorodecyltrichlorosilane (FDTS), a highly fluorinated monomer or oligomeric material, and a polymer material such as polytetrafluoroethylene (PTFE).

In an embodiment, the hydrophobic layer 250 may include a fluorine-based molecule including at least one —$CF_3$ group at an end thereof. In the case of a —CF2 functional group in which two fluorine atoms are bonded to a carbon atom, surface energy is about 18 mJ/m$^2$, which is relatively lower than the surface energy of most inorganic materials including metals. Furthermore, in the case of a —$CF_3$ functional group in which three fluorine atoms are bonded to a carbon atom, the surface energy is very low (e.g., about 6 mJ/m$^2$). Thus, the hydrophobic layer 250 including the fluorine-based molecule including the —$CF_3$ group may prevent a metal layer (e.g., an opposite electrode) from being formed in the transmission area TA.

The opposite electrode 230 may include an opening 230OP corresponding to the transmission area TA. As described above, the opposite electrode 230 is not formed on the hydrophobic layer 250 because of the difference in surface energy. For example, in the manufacturing process, the opposite electrode 230 may be deposited on or applied onto the entire surface of the display area DA but may not be selectively formed in the transmission area TA in which the hydrophobic layer 250 is arranged.

Fine particles 230P may be arranged on the hydrophobic layer 250 of the transmission area TA. The fine particles 230P and the opposite electrode 230 may include the same material. The material for forming the opposite electrode 230 deposited on or applied onto the transmission area TA may have very low spreadability on the hydrophobic layer 250, and thus may not have a layer shape like the pixel area PA and may be agglomerated in the form of particles on the hydrophobic layer 250 to form the fine particles 230P.

Referring to FIG. 5, the fine particles 230P may be spaced apart from each other on the hydrophobic layer 250, and some of the fine particles 230P may contact each other. The fine particles 230P may not be provided on the entire surface of the hydrophobic layer 250. The fine particles 230P may be selectively present in a portion of the hydrophobic layer 250. With this structure, the opposite electrode 230 is not present on the transmission area TA, so that the transmittance of the transmission area TA may be improved.

FIGS. 6A to 6C illustrates transmission electron microscope (TEM) images of the opposite electrode 230 and the fine particles 230P.

Figure 6:
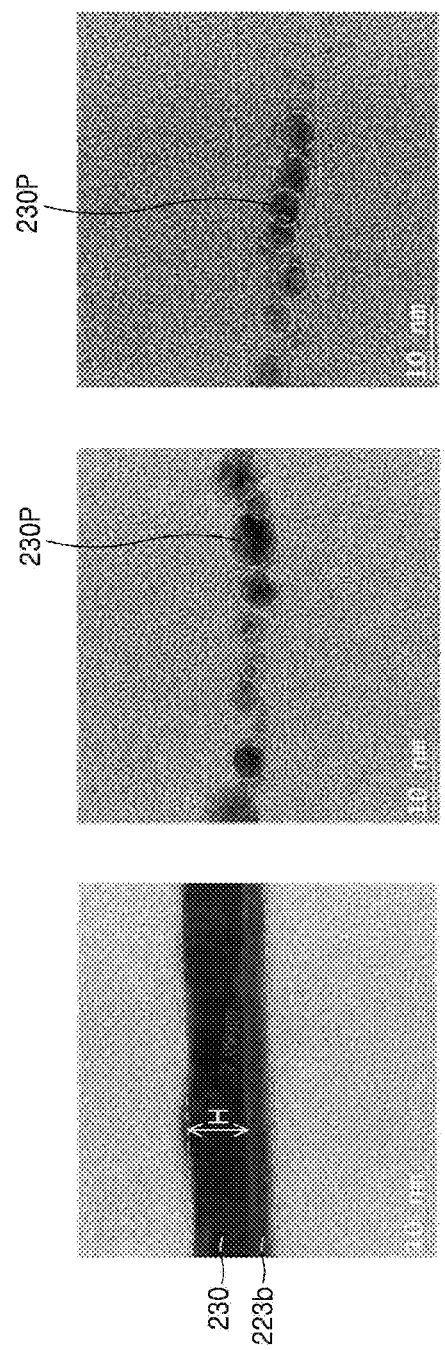
FIGS. 6A to 6C illustrates transmission electron microscope (TEM) images of an opposite electrode and fine particles.

Referring to FIGS. 5 and 6, a diameter D of each of the fine particles 230P may be in a range of about 1 nm to about 10 nm. A thickness H of the opposite electrode 230 in the pixel area PA may be in a range of about 7 nm to about 10 nm. Therefore, the diameter D of each of the fine particles 230P may be 10 nm or less and about 1 nm or greater.

As illustrated in FIG. 6A, the opposite electrode 230 may be arranged in the pixel area PA, or the display area DA excluding the transmission area TA, and the EIL (see the EIL 223b of FIG. 9) may be arranged below the opposite electrode 230. In FIG. 6A, the EIL 223b may have a thickness of about 2.23 nm, and the opposite electrode 230 may have a thickness of about 7.09 nm.

FIGS. 6B and 6C illustrate that the fine particles 230P are formed in the transmission area TA. As described above, because of the hydrophobic layer 250, the fine particles 230P may not form a layer as illustrated in FIG. 6A and may be formed in the form of particles. FIGS. 6B and 6C illustrate the fine particles 230P formed to have a diameter less than the thickness of the opposite electrode 230.

In an embodiment, in the same area, the volume ratio of the fine particles 230P may be about 30% or less of that of the opposite electrode 230. This means that, as the volume ratio of the fine particles 230P decreases, the transmittance of the transmission area TA is improved. Therefore, the volume ratio of the fine particles 230P may be about 30% or less of that of the opposite electrode 230, but the transmittance of the transmission area TA may be advantageously secured as the volume ratio of the fine particles 230P decreases.

The capping layer 240 may be arranged on the fine particles 230P of the transmission area TA. FIG. 4 illustrates that the capping layer 240 is also arranged in the transmission area TA, and thus may be provided on the entire surface of the display area DA, but the disclosure is not limited thereto. In case that the capping layer 240 is arranged in the transmission area TA, at least a portion of the capping layer 240 may contact the hydrophobic layer 250. The fine particles 230P may be spaced apart from each other in some areas, and the capping layer 240 may contact the hydrophobic layer 250 in an area between the fine particles 230P spaced apart from each other.

In another embodiment, as illustrated in FIG. 8, the capping layer 240 may be patterned to include an opening 240OP corresponding to the transmission area TA. Similar to the opposite electrode 230, in case that the capping layer 240 is arranged in the transmission area TA, the capping layer 240 may act as a factor of impairing the transmittance of the transmission area TA. Therefore, the capping layer 240 may be patterned to include the opening 240OP corresponding to the transmission area TA, thereby improving the transmittance of the transmission area TA. In an embodiment, the opening 240OP of the capping layer 240 may be formed by using a shadow mask.

FIG. 8 illustrates that an end of the capping layer 240, forming the opening 240OP is located above the third organic insulating layer 119, but the disclosure is not limited thereto. The width of the opening 240OP of the capping layer 240 in a direction (e.g., the x-direction) may be equal to or greater than the width of the transmission area TA.

The thin-film encapsulation layer 300 may be arranged on the capping layer 240. As described above, the thin-film encapsulation layer 300 may also be arranged in the transmission area TA.

FIGS. 9 and 10 are cross-sectional views schematically illustrating a portion of a display apparatus, according to an embodiment.

The embodiments of FIGS. 9 and 10 are similar to the embodiment of FIG. 4 described above, but differ from the embodiment of FIG. 4 at least in that a second common layer 223 may include an ETL 223a and an EIL 223b, and a hydrophobic layer 250 may be arranged directly on the ETL 223a. Hereinafter, differences will be mainly described.

The second common layer 223 may be provided over the entire surface of the display area DA and may include the ETL 223a and the EIL 223b. As illustrated in FIG. 9, the ETL 223a and the EIL 223b may be sequentially stacked on the emission layer 222 in correspondence with the pixel area PA, and the opposite electrode 230 may be arranged on the EIL 223b.

In the transmission area TA, the hydrophobic layer 250 may be arranged directly on the ETL 223a. In other words, in a manufacturing process, the hydrophobic layer 250 is formed after the ETL 223a is formed and before the EIL 223b is formed. The EIL 223b is not provided on the hydrophobic layer 250, and the fine particles 230P described above may be partially provided. The capping layer 240 and the thin-film encapsulation layer 300 may be arranged on the fine particles 230P.

In the embodiment, the EIL 223b may include a metal material, for example, ytterbium (Yb). The EIL 223b may include the metal material, and the EIL 223b may act as a factor of impairing the transmittance of the transmission area TA, similar to the opposite electrode 230. Therefore, in an embodiment, the hydrophobic layer 250 may be arranged before the EIL 223b is formed. For example, the hydrophobic layer 250 is arranged directly on the ETL 223a, so that the EIL 223b is not formed in the transmission area TA because of the hydrophobic layer 250.

In another embodiment, as illustrated in FIG. 10, a capping layer 240 may be patterned to include an opening 240OP corresponding to the transmission area TA. Similar to the opposite electrode 230, in case that the capping layer 240 is arranged in the transmission area TA, the capping layer 240 may act as a factor of impairing the transmittance of the transmission area TA. Therefore, the capping layer 240 may be patterned to include the opening 240OP corresponding to the transmission area TA, thereby improving the transmittance of the transmission area TA.

Figure 11:
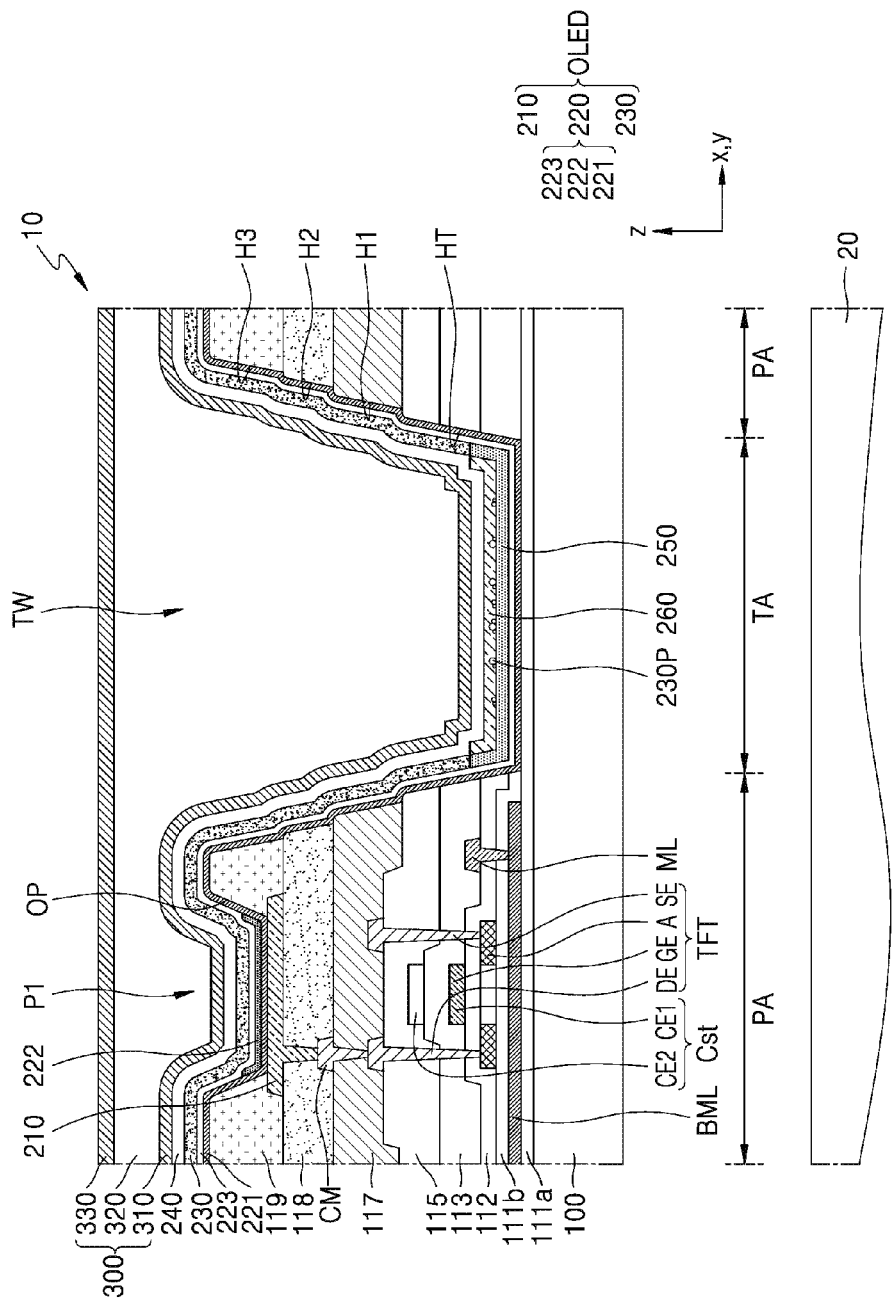
FIGS. 11 and 12 are cross-sectional views schematically illustrating a portion of a display apparatus, according to an embodiment.
Figure 12:
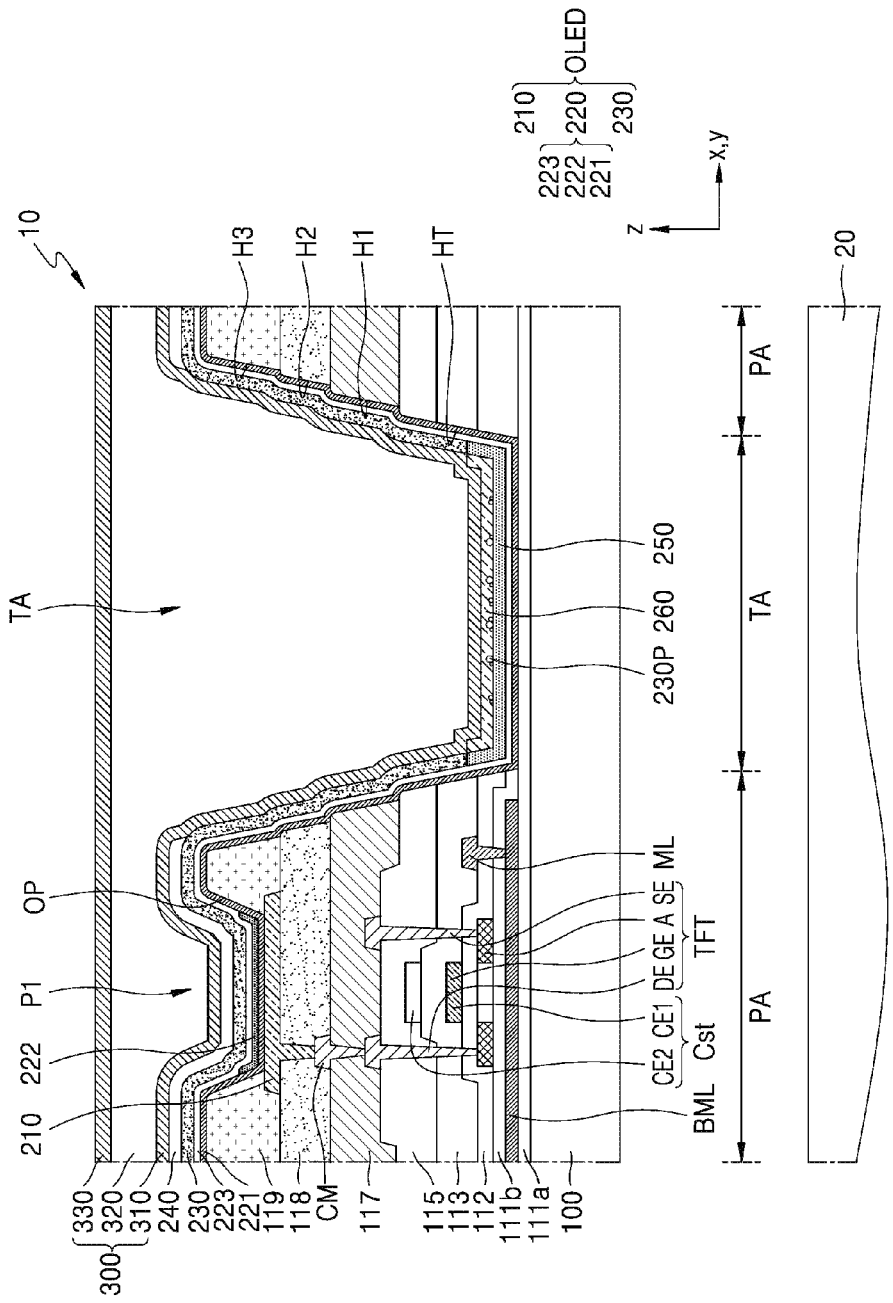

FIGS. 11 and 12 are cross-sectional views schematically illustrating a portion of a display apparatus, according to an embodiment.

The embodiments of FIGS. 11 and 12 are similar to the embodiment of FIG. 4 described above but differ from the embodiment of FIG. 4 at least in that an optical functional layer 260 is further provided on a hydrophobic layer 250. Hereinafter, differences will be mainly described.

The optical functional layer 260 may be arranged on the hydrophobic layer 250, in correspondence with the transmission area TA. The optical functional layer 260 may have a refractive index less than that of the capping layer 240. The optical functional layer 260 may concentrate light in the transmission area TA to improve light emission efficiency. In an embodiment, the optical functional layer 260 may have a refractive index of about 1.3 to about 1.6 and may have a thickness of about 100 Å to about 1,000 Å. The optical functional layer 260 may include an organic material and/or an inorganic material satisfying the above-described refractive index.

The capping layer 240 may be arranged on the optical functional layer 260. For example, in the embodiment, the capping layer 240 may also be arranged in the transmission area TA, in correspondence with the entire surface of the display area DA.

In another embodiment, as illustrated in FIG. 12, the capping layer 240 may not be arranged on the optical functional layer 260. The capping layer 240 may be patterned to include an opening 240OP corresponding to the transmission area TA. Similar to the opposite electrode 230, in case that the capping layer 240 is arranged in the transmission area TA, the capping layer 240 may act as a factor of lowering the transmittance of the transmission area TA. Therefore, the capping layer 240 may be patterned to include the opening 240OP corresponding to the transmission area TA, thereby improving the transmittance of the transmission area TA. In this case, a first inorganic encapsulation layer 310 may be directly arranged on the optical functional layer 260 in the transmission area TA.

Figure 13:
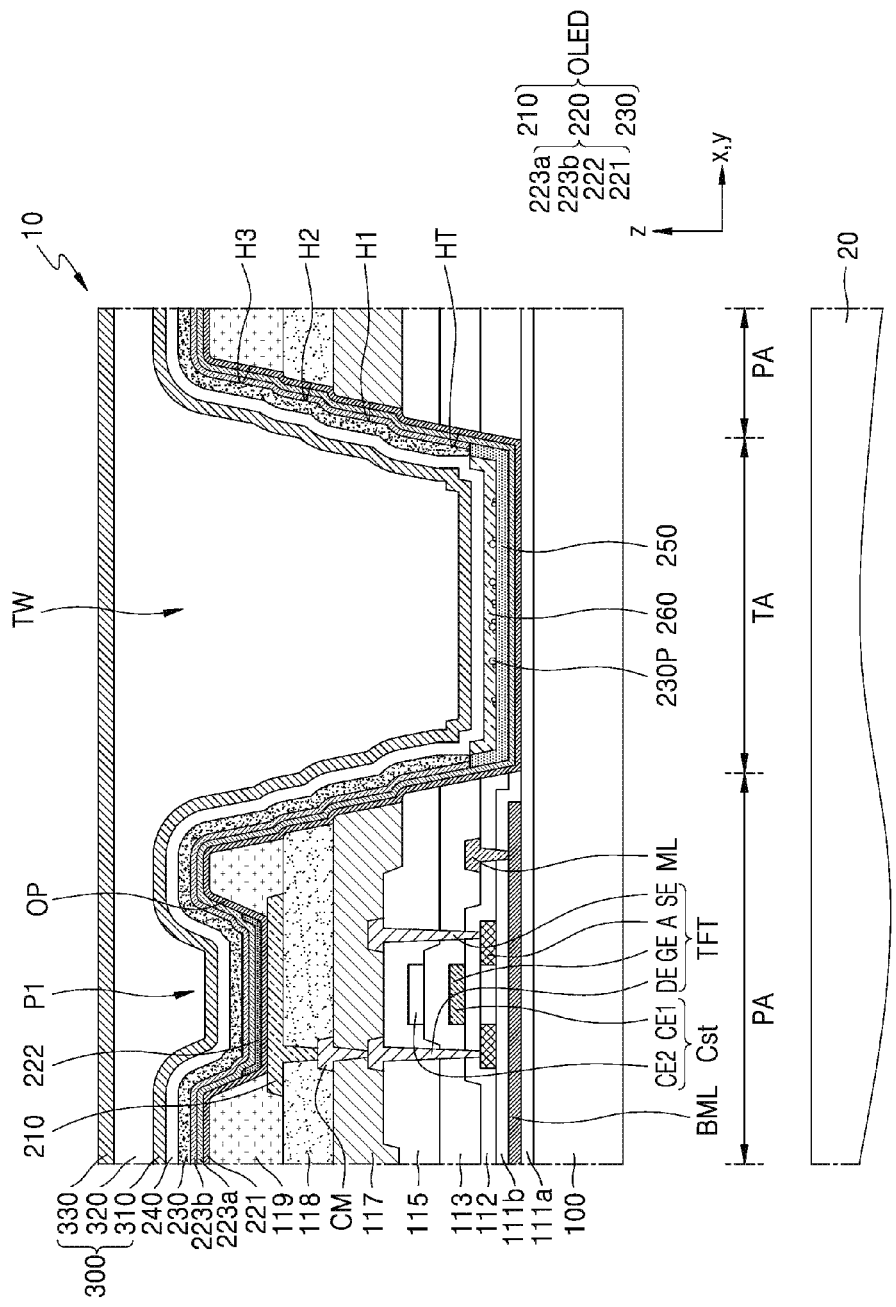
FIGS. 13 and 14 are cross-sectional views schematically illustrating a portion of a display apparatus, according to an embodiment.
Figure 14:
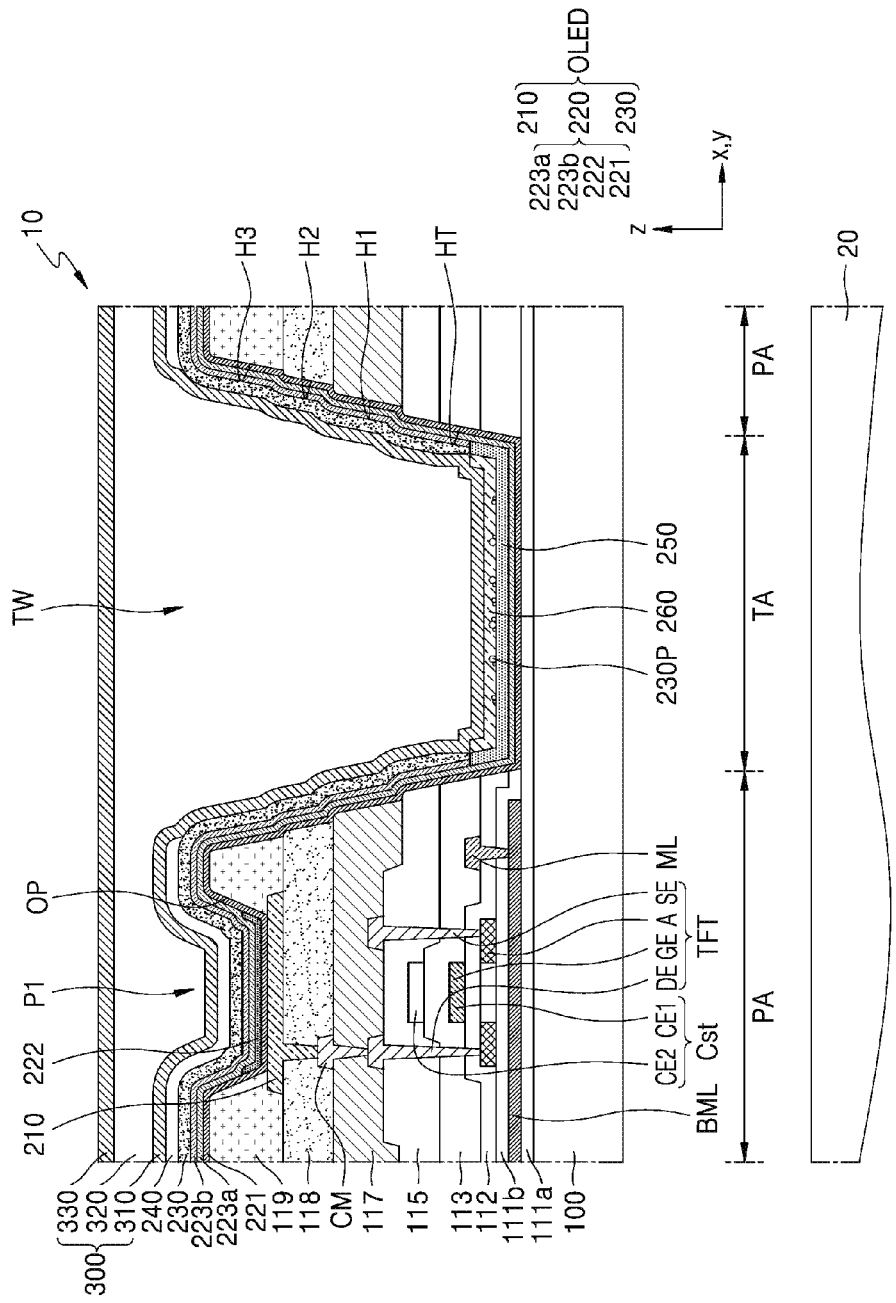

FIGS. 13 and 14 are cross-sectional views schematically illustrating a portion of a display apparatus, according to an embodiment.

The embodiments of FIGS. 13 and 14 are similar to the embodiment of FIG. 4 described above, but differ from the embodiment of FIG. 4 at least in that a second common layer 223 includes an ETL 223a and an EIL 223b, and an optical functional layer 260 is arranged on a hydrophobic layer 250. Hereinafter, differences will be mainly described.

Referring to FIG. 13, the second common layer 223 may include the ETL 223a and the EIL 223b. The ETL 223a and the EIL 223b may be sequentially stacked on an emission layer 222, in correspondence with the pixel area PA, and an opposite electrode 230 may be arranged on the EIL 223b. In the embodiment, the EIL 223b may include a metal material, for example, ytterbium (Yb). Because the EIL 223b includes the metal material, the EIL 223b may act as a factor of lowering the transmittance of the transmission area TA, similar to the opposite electrode 230.

Therefore, in an embodiment, the hydrophobic layer 250 may be arranged directly on the ETL 223a, so that the EIL 223b is not formed in the transmission area TA because of the hydrophobic layer 250.

In the transmission area TA, the optical functional layer 260 may be arranged on the hydrophobic layer 250. The optical functional layer 260 may have a refractive index less than that of a capping layer 240. The optical functional layer 260 may concentrate light in the transmission area TA to improve light emission efficiency. In an embodiment, the optical functional layer 260 may have a refractive index of about 1.3 to about 1.6 and may have a thickness of about 100 Å to about 1,000 Å. The optical functional layer 260 may include an organic material and/or an inorganic material satisfying the above-described refractive index.

The capping layer 240 may be arranged on the optical functional layer 260. For example, in the embodiment, the capping layer 240 may also be arranged in the transmission area TA, in correspondence with the entire surface of the display area DA.

In another embodiment, as illustrated in FIG. 14, the capping layer 240 may not be arranged on the optical functional layer 260. The capping layer 240 may be patterned to include an opening 240OP corresponding to the transmission area TA. Similar to the opposite electrode 230, in case that the capping layer 240 is arranged in the transmission area TA, the capping layer 240 may act as a factor of lowering the transmittance of the transmission area TA. Therefore, the capping layer 240 may be patterned to include the opening 240OP corresponding to the transmission area TA, thereby improving the transmittance of the transmission area TA. In this case, a first inorganic encapsulation layer 310 may be directly arranged on the optical functional layer 260 in the transmission area TA.

Figure 15:
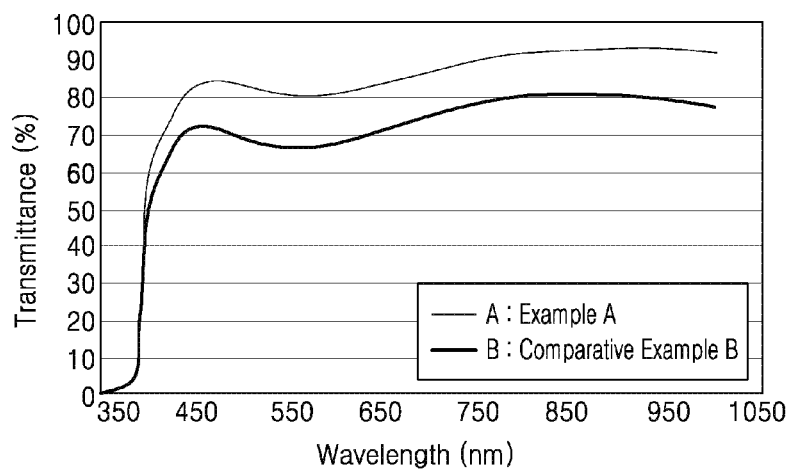
FIG. 15 is an experimental graph showing a change in transmittance of a transmission area according to the presence or absence of a hydrophobic layer.

FIG. 15 is an experimental graph showing a change in the transmittance of the transmission area TA according to the presence or absence of the hydrophobic layer 250.

Referring to FIG. 15 together with the above-described embodiments, to form identical conditions to the above-described transmission area TA, in the case of Example A, first and second common layers 221 and 223 (e.g., including an HIL/HTL/ETL structure having a thickness of about 1,520 Å) were deposited on a glass substrate, a hydrophobic layer 250 was formed on the first and second common layers 221 and 223, and an opposite electrode 230 (e.g., an AgMg layer having a thickness of about 100 Å) was formed thereon. In the case of Comparative Example B, first and second common layers 221 and 223 (e.g., including an HIL/HTL/ETL structure having a thickness of about 1,520 Å), were deposited on a glass substrate, and an opposite electrode 230 (e.g., an AgMg layer having a thickness of about 90 Å) was formed directly on the first and second common layers 221 and 223.

As illustrated in FIG. 15, it can be seen that a change in the transmittance is 10% or greater in a wavelength range of about 450 nm or greater according to the presence or absence of the hydrophobic layer 250. For example, it was found that the transmittance of Example A including the hydrophobic layer 250 is 10% or more superior to that of Comparative Example B. In the case of Example A, in forming the opposite electrode 230, the transmittance of the transmission area TA may be easily secured by the hydrophobic layer 250 without a separate patterning process corresponding to the transmission area TA.

Although the display apparatus has been described, the disclosure is not limited thereto. For example, methods of manufacturing the display apparatus will also fall within the scope of the disclosure.

FIGS. 16A to 16D are cross-sectional views schematically illustrating part of a process of manufacturing a display apparatus, according to an embodiment.

Figure 16A:
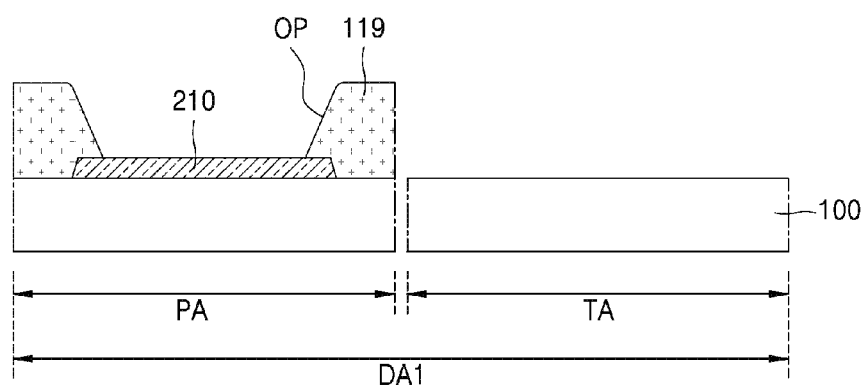
FIGS. 16A to 16D are cross-sectional views schematically illustrating part of a process of manufacturing a display apparatus, according to an embodiment.

Referring to FIG. 16A, after a pixel electrode 210 is formed on a pixel area PA, a third organic insulating layer 119 may be formed to include the opening OP overlapping the edge of the pixel electrode 210 and exposing a central portion thereof. The pixel electrode 210 and the third organic insulating layer 119 may not be formed on a transmission area TA. For convenience of description, FIGS. 16A to 16D illustrate that the pixel electrode 210 is formed directly on a substrate 100. However, in practice, it may be understood that, after various elements including a thin-film transistor, wirings, and insulating layers are formed on the substrate 100 as illustrated in FIG. 4, the pixel electrode 210 is formed thereon.

Figure 16B:
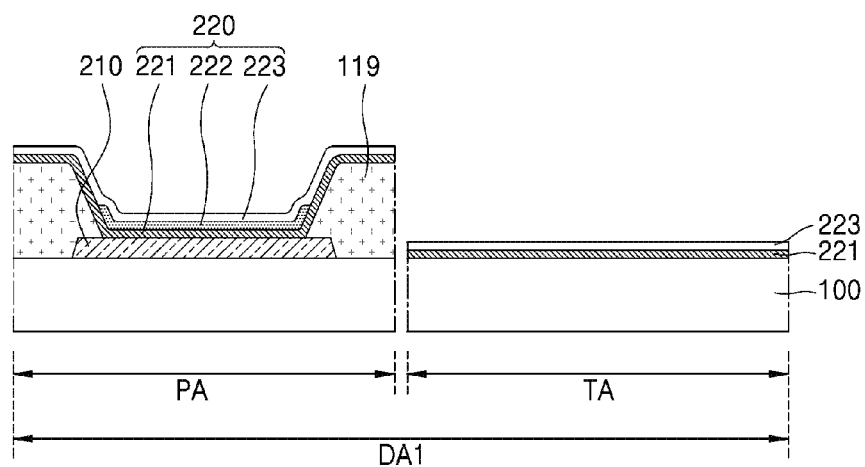

Subsequently, as illustrated in FIG. 16B, an intermediate layer 220 may be formed on the pixel electrode 210. More specifically, a first common layer 221 may be formed on the pixel electrode 210, an emission layer 222 may be formed on the first common layer 221, and a second common layer 223 may be formed on the emission layer 222. The emission layer 222 may be patterned for each pixel and formed only on the pixel electrode 210, whereas the first and second common layers 221 and 223 are formed on both the pixel area PA and the transmission area PA.

Figure 16C:
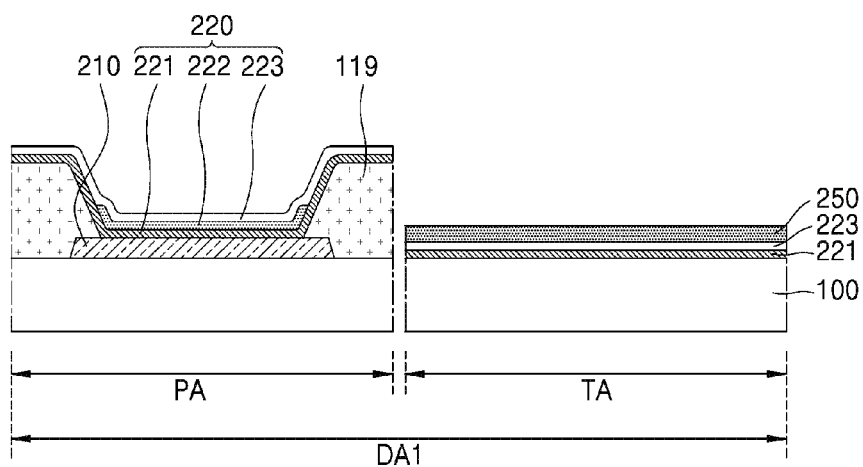

Next, as illustrated in FIG. 16C, a hydrophobic layer 250 may be formed on the transmission area TA. The hydrophobic layer 250 may include a fluorine-based organic material and may have liquid-repellent properties. The basic characteristics of the hydrophobic layer 250 may be the same as described above. The hydrophobic layer 250 may be formed by using a process of a deposition method such as dry film formation, wet coating, screen printing, inkjet printing, or the like.

The hydrophobic layer 250 according to the embodiment may include a fluorine-based molecule including at least one —$CF_3$ group at an end thereof, and thus the surface energy of the hydrophobic layer 250 may be very low, as compared with that of most inorganic materials including metals. In case that a layer having a relatively high surface energy is formed on a layer having very low surface energy, an upper layer is not normally formed because of poor spreadability.

Figure 16D:
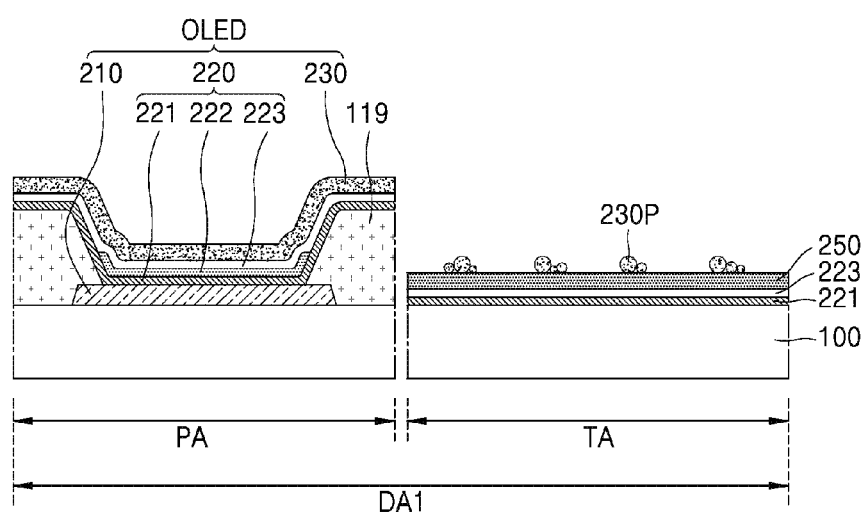

Next, as illustrated in FIG. 16D, an electrode material may be applied onto the entire surfaces of the pixel area PA and the transmission area TA. The electrode material applied onto the pixel area PA may form an opposite electrode 230. The electrode material applied onto the transmission area TA may form fine particles 230P. For example, the electrode material on the pixel area PA may be formed on the second common layer 223 as a layer having a thickness equal to that of the opposite electrode 230, and the electrode material on the transmission area TA may not be formed on the hydrophobic layer 250 as a layer, but may be formed as fine particles 230P including material(s) identical to that of the opposite electrode 230.

As described above, it means that, because of the surface energy of the hydrophobic layer 250, the electrode material does not form a layer as in the pixel area PA, but is agglomerated in the form of particles on the hydrophobic layer 250 to form the fine particles 230P. In an embodiment, in the same area, the volume ratio of the fine particles 230P may be about 30% or less of that of the opposite electrode 230.

As described above, in the display apparatus 1 according to the embodiment, the hydrophobic layer 250 may be provided in the transmission area TA so that the opposite electrode 230 is selectively formed only in the pixel area PA. Therefore, the display apparatus 1 may prevent the opposite electrode 230 from being formed in the transmission area TA without a process of patterning the opposite electrode 230, thereby improving the transmittance of the transmission area TA.

According to one or more embodiments, a display apparatus including an expanded display area enabling images to be displayed even in an area in which a component is arranged and a method of manufacturing the display apparatus are provided. The scope of the disclosure is not limited by these effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:
   preparing a substrate including a display area and a peripheral area adjacent to the display area, the display area comprising a transmission area and a pixel area;
   forming a pixel electrode corresponding to the pixel area;
   forming an intermediate layer on the pixel electrode corresponding to the pixel area and the transmission area;
   forming a hydrophobic layer on the intermediate layer corresponding to the transmission area; and
   applying an electrode material onto the intermediate layer corresponding to the pixel area and onto the hydrophobic layer corresponding to the transmission area.

2. The method of claim 1, wherein the applying of the electrode material comprises:
   forming an opposite electrode on the intermediate layer corresponding to the pixel area; and
   forming a plurality of fine particles on the hydrophobic layer corresponding to the transmission area.

3. The method of claim 2, wherein the forming of the opposite electrode and the forming of the plurality of fine particles are performed simultaneously.

4. The method of claim 2, wherein
   the electrode material has hydrophilicity, and
   the forming of the opposite electrode includes forming the opposite electrode only in the pixel area by the hydrophobic layer.

5. The method of claim 1, wherein, in a direction perpendicular to a surface of the substrate upon which the pixel electrode is formed, the pixel electrode does not overlap the transmission area.

6. The method of claim 1, wherein, in a direction perpendicular to a surface of the substrate upon which the hydrophobic layer is formed, the hydrophobic layer does not overlap the pixel area.

7. The method of claim 1, wherein, in a view in a direction perpendicular to a surface of the substrate upon which the pixel electrode is disposed, the hydrophobic layer is spaced apart from the pixel electrode.

8. The method of claim 1, wherein forming the intermediate layer comprises:
forming a first common layer on the substrate in correspondence with both the pixel area and the transmission area; and
forming an emission layer on the first common layer in correspondence with the pixel area such that the emission layer overlaps the pixel electrode.

9. The method of claim 8, wherein the emission layer is not formed in correspondence with the transmission area.

10. The method of claim 8, wherein
forming the intermediate layer further comprises forming a second common layer on the substrate in correspondence with both the pixel area and the transmission area,
in correspondence with the pixel area, the emission layer is disposed between the second common layer and the first common layer, and
in correspondence with the transmission area, both the first common layer and the second common layer are disposed between the hydrophobic layer and the substrate.

11. The method of claim 2, further comprising:
forming a capping layer on the opposite electrode in correspondence with the pixel area,
wherein, in a view in a direction perpendicular to a surface of the substrate upon which the pixel electrode is disposed, the capping layer is spaced apart from the transmission area.

12. The method of claim 11, further comprising:
forming an encapsulation layer on the capping layer in correspondence with the pixel area and on the hydrophobic layer in correspondence with the transmission area,
wherein, in correspondence with the transmission area, the plurality of fine particles is disposed between the encapsulation layer and the hydrophobic layer.

13. The method of claim 2, further comprising:
forming a capping layer on the opposite electrode in correspondence with the pixel area and on the hydrophobic layer in correspondence with the transmission area,
wherein, in correspondence with the transmission area, the plurality of fine particles is disposed between the capping layer and the hydrophobic layer.

14. The method of claim 1, wherein
the hydrophobic layer comprises a first surface facing the substrate and a second surface opposing the first surface, and
applying the electrode material comprises forming a plurality of fine particles on the second surface of the hydrophobic layer in correspondence with the transmission area.

15. The method of claim 14, wherein the plurality of fine particles are formed only in correspondence with the transmission area.

16. The method of claim 1, wherein, in a direction perpendicular to a surface of the substrate upon which the pixel electrode is disposed, the intermediate layer is formed closer to the substrate in correspondence with the transmission area than in correspondence with the pixel area.

17. The method of claim 1, wherein, in a direction perpendicular to a surface of the substrate upon which the pixel electrode is disposed, the hydrophobic layer is formed closer to the substrate than the pixel electrode.

18. A method of manufacturing a display apparatus, the method comprising:
forming, on a surface of a substrate, a pixel electrode in a pixel area of a display area of the display apparatus, the display area further comprising a transmission area adjacent to the pixel area, the display apparatus further comprising a peripheral area outside the display area;
forming an intermediate layer on the pixel electrode in the pixel area and on the substrate in the transmission area;
forming a hydrophobic layer on the intermediate layer in the transmission area; and
applying an electrode material on both the intermediate layer in the pixel area and on the hydrophobic layer in the transmission area,
wherein, in a direction perpendicular to the surface of the substrate, the hydrophobic layer is formed closer to the substrate than the pixel electrode.

19. The method of claim 18, wherein applying the electrode material on both the intermediate layer in the pixel area and on the hydrophobic layer in the transmission area comprises:
forming an opposite electrode on the intermediate layer in the pixel area; and
forming a plurality of fine particles on the hydrophobic layer in the transmission area.

20. The method of claim 19, wherein the plurality of fine particles are formed on the hydrophobic layer in the transmission area during formation of at least a portion of the opposite electrode on the intermediate layer in the pixel area.

* * * * *